United States Patent
Chadwick et al.

(10) Patent No.: US 9,822,467 B2
(45) Date of Patent: Nov. 21, 2017

(54) METHODS AND SYSTEMS RELATING TO THE SELECTION OF SUBSTRATES COMPRISING CRYSTALLINE TEMPLATES FOR THE CONTROLLED CRYSTALLIZATION OF MOLECULAR SPECIES

(71) Applicant: Massachusetts Institute of Technology, Cambridge, MA (US)

(72) Inventors: Keith Chadwick, Lexington, IN (US); Bernhardt Levy Trout, Lexington, MA (US); Allan Stuart Myerson, Boston, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 792 days.

(21) Appl. No.: 13/677,813

(22) Filed: Nov. 15, 2012

(65) Prior Publication Data

US 2013/0118399 A1    May 16, 2013

Related U.S. Application Data

(60) Provisional application No. 61/559,772, filed on Nov. 15, 2011.

(51) Int. Cl.
  *C30B 19/12*  (2006.01)
  *C09K 3/00*  (2006.01)
  *C30B 7/00*  (2006.01)
  *C30B 29/54*  (2006.01)

(52) U.S. Cl.
  CPC ............ *C30B 19/12* (2013.01); *C09K 3/00* (2013.01); *C30B 7/00* (2013.01); *C30B 29/54* (2013.01)

(58) Field of Classification Search
  CPC .. C30B 7/00; C30B 7/005; C30B 7/14; C30B 9/00; C30B 9/04; C30B 19/00; C30B 19/02; C30B 19/10; C30B 19/12; C30B 29/00; C30B 29/54; C09K 3/00
  USPC .................... 117/11, 54, 56, 58, 63, 68, 902
  See application file for complete search history.

(56) References Cited

U.S. PATENT DOCUMENTS

| 6,001,176 A | 12/1999 | Leiter et al. |
| 6,017,390 A | 1/2000 | Charych et al. |
| 6,083,812 A * | 7/2000 | Summerfelt ........ H01L 21/0445 117/950 |
| 6,593,118 B2 | 7/2003 | Heng |
| 6,596,077 B2 | 7/2003 | Myerson |

(Continued)

OTHER PUBLICATIONS

Lee, et al. publication entitled "Crystallization on confined engineered surfaces: a method to control crystal size and generate different polymorphs," Jounal of the American Chemical Society, vol. 127, pp. 14982-14983 (2005).*

(Continued)

*Primary Examiner* — Kenneth A Bratland, Jr.
(74) *Attorney, Agent, or Firm* — Wolf, Greenfield & Sacks, P.C.

(57) ABSTRACT

The present invention generally relates to methods and systems relating to the selection of substrates comprising crystalline templates for the controlled crystallization of molecular species. In some embodiments, the methods and systems allow for the controlled crystallization of a molecular species in a selected polymorphic form. In some embodiments, the molecular species is a small organic molecule (e.g., pharmaceutically active agent).

16 Claims, 7 Drawing Sheets

(56) References Cited

U.S. PATENT DOCUMENTS

| | | | |
|---|---|---|---|
| 6,645,293 | B2 | 11/2003 | Myerson et al. |
| 6,759,521 | B2 | 7/2004 | Myerson et al. |
| 7,252,713 | B2 | 8/2007 | Chayen et al. |
| 7,329,592 | B2 | 2/2008 | Myerson et al. |
| 8,183,290 | B2 | 5/2012 | Tawa et al. |
| 9,138,659 | B2 | 9/2015 | Trout et al. |
| 2006/0109532 | A1 | 5/2006 | Savas et al. |
| 2012/0076860 | A1 | 3/2012 | Trout et al. |
| 2016/0129019 | A1 | 5/2016 | Trout et al. |

OTHER PUBLICATIONS

Lee, et al. publication entitled "Crystallization on confined engineered surfaces: a method to control crystal size and generate different polymorphs," Jounal of the American Chemical Society, vol. 127, pp. 14982-14983 (2005).J.-O. Henck, et al. publication entitled "Disappearing and reappearing polymorphs. The benzocaine:Picric acid system" Journal o.*

J.-O. Henck, et al. publication entitled "Disappearing and reappearing polymorphs. The benzocaine:Picric acid system" Journal of the American Chemical Society, vol. 123, pp. 1834-1841 (2000).*

B.K. Olmsted, et al. publication entitled "The role of chemical interactions and epitaxy during nucleation of organic crystals on crystalline substrates," CrystEngComm, vol. 13, pp. 1070-1073 (2011).*

Chayen et al., Experiment and theory for heterogeneous nucleation of protein crystals in a porous medium. Proc Natl Acad Sci U S A. Jan. 17, 2006;103(3):597-601. Epub Jan. 6, 2006.

Diao et al., Controlled nucleation from solution using polymer microgels. J Am Chem Soc. Mar. 23, 2011;133(11):3756-9. doi: 10.1021/ja110801g. Epub Feb. 23, 2011.

Diao et al., The role of nanopore shape in surface-induced crystallization. Nat Mater. Sep. 11, 2011;10(11):867-71. doi: 10.1038/nmat3117.

Saridakis et al., Protein crystallization facilitated by molecularly imprinted polymers. Proc Natl Acad Sci U S A. Jul. 5, 2011;108(27):11081-6. doi: 10.1073/pnas.1016539108. Epub Jun. 20, 2011. Erratum in: Proc Natl Acad Sci U S A. Nov. 8, 2011;108(45):18566.

Invitation to Pay Additional Fees for PCT/US2011/048851 dated Mar. 7, 2012.

International Search Report and Written Opinion for PCT/US2011/048851 dated May 14, 2012.

International Preliminary Report on Patentability for PCT/US2011/048851 dated Mar. 7, 2013.

Aguiar et al., Dissolution behavior of polymorphs of chloramphenicol palmitate and mefenamic acid. J Pharm Sci. Aug. 1969;58(8):983-7.

Aizenberg et al., Control of Crystal Nucleation by Patterned Self-Assembled Monolayers; Nature; 1999; 398 (6727); 495-498.

Aizenberg et al., Oriented Growth of Calcite Functionalized Alkanethiols Supported on Gold Controlled by Self-Assembled Monolayers of and Silver; Journal of the American Chemical Society; 1999; 121 (18); 4500-4509.

Allen et al., The Crystallization of Glycine Polymorphs from Emulsions, Microemulsions, and Lamellar Phases. Cryst Growth Des. 2002;2(6):523-7.

Alvarez et al., Polymorph Screening: Comparing a Semi-Automated Approach with a High Throughput Method. Cryst Growth Des. 2009;9(9):4181-8.

Seiner et al., Manipulating the Crystalline State of Pharmaceuticals by Nanoconfinement; Nano Letters; 2007; vol. 7, No. 5; 1381-1385.

Berman et al., Total Alignment of Calcite at Acidic Polydiacetylene Films—Cooperativity at the Organic-Inorganic Interface; Science; 1995; 269 (5223); 515-518.

Bernstein et al., Concomitant Polymorphs. Angewandte Chem Int Ed. Dec. 3, 1999;38(23):3440-61.

Bernstein, Polymorphism—A Perspective. Cryst Growth Des. 2011;11(3):632-50.

Briseno et al., Patterned growth of large oriented organic semiconductor single crystals on self-assembled monolayer templates. J Am Chem Soc. Sep. 7, 2005;127(35):12164-5.

Briseno et al., Patterning organic single-crystal transistor arrays. Nature. Dec. 14, 2006;444(7121):913-7.

Bunker et al., Ceramic Thin-Film Formation on Functionalized Interfaces Through Biomimetic Processing. Science; 1994, 264 (5155), 48-55.

Cacciuto et al., Onset of heterogeneous crystal nucleation in colloidal suspensions. Nature. Mar. 25, 2004;428(6981):404-6.

Canal et al., Correlation between mesh size and equilibrium degree of swelling of polymeric networks. J Biomed Mater Res. Oct. 1989;23(10):1183-93.

Capes et al., Effect of Polymer Addition on the Contact Line Crystallisation of Paracetamol; CrystEngComm; 2007; 9; 84-90.

Carter et al., Topographically Directed Nucleation of Organic-Crystals on Molecular Single-Crystal Substrates; Journal of the American Chemical Society; 1993; 115 (24); 11521-11535.

Chadwick et al., Controlling the Crystal Structure of Active Pharmaceutical Ingredients Using Heterogeneous Surfaces. Purdue University presentation Nov. 2011.

Chadwick et al., Heteroepitixial Control of Crystal Nucleation Using Crystalline Substrates. Oral presentation at the annual meeting of the American Institute of Chemical Engineers. Oct. 28-Nov. 2, 2012. Pittsburgh, PA.

Chadwick et al., Polymorphic control by heterogeneous nucleation—A new method for selecting crystalline substrates. Cryst Eng Comm. 2011;13(22):6625-7.

Chadwick et al., Toward the Rational Design of Crystalline Surfaces for Heteroepitaxy: Role of Molecular Functionality. Cryst Growth Des. 2012;12:1159-66.

Chayen et al., Porous Silicon: An Effective Nucleation-Inducing Material for Protein Crystallization; J. Mol. Bio; 2001; 312; 591-595.

Chen et al., Cross-nucleation between ROY polymorphs. J Am Chem Soc. Dec. 14, 2005;127(49):17439-44.

Cox et al., Selective Growth of a Stable Drug Polymorph by Suppressing the Nucleation of Corresponding Metastable Polymorphs; Angew. Chem. Int. Ed.; 2007; 46, 4333-4336.

Curcio et al., Energetics of protein nucleation on rough polymeric surfaces. J Phys Chem B. Nov. 4, 2010;114(43):13650-5. doi:10.1021/jp106349d.

Czugler et al., Structure of the unstable monoclinic 1,2,3,5-tetra-O-acetyl-β-D-ribofuranose. Acta Cryst. Jan. 1981;37(1):172-7.

Davey et al., Crystal engineering—nucleation, the key step. Cryst Eng Comm. 2002;4(47):257-64. doi:10.1039/B203521A.

Dendukuri et al., Stop-flow lithography in a microfluidic device. Lab Chip. Jul. 2007;7(7):818-28. Epub May 21, 2007.

Desgranges et al., Insights into the molecular mechanism underlying polymorph selection. J Am Chem Soc. Nov. 29, 2006;128(47):15104-5.

Dey et al., The role of prenucleation clusters in surface-induced calcium phosphate crystallization. Nat Mater. Dec. 2010;9(12):1010-4. doi: 10.1038/nmat2900. Epub Nov. 14, 2010.

Diao et al., Controlled Nucleation From Solution Using Polymer Microgels with Tunable Structure. Abstract of presentation at the annual meeting of the American Institute of Chemical Engineers. Nov. 7-12, 2010. Salt Lake City, Utah.

Diao et al., Nucleation Under Soft Confinement: Role of Polymer-Solute Interactions; Crystal Growth & Design; 2012, 12(1); 508-517.

Diao et al., Rational Design of Polymeric Nucleants for Controlling Nucleation From Solution; Presentation at the American Chemical Society meeting, Anaheim; Mar. 30, 2011.

Diao et al., Surface Design for Controlled Crystallization: The Role of Surface Chemistry and Nanoscale Pores in Heterogeneous Nucleation; American Chemical Society; 2011; 27(9); 5324-5334.

Diao et al., Towards surface design to control crystallization: Understanding the roles of surface chemistry and morphology in heterogeneous nucleation. ACS Presentation Abstract No. 250. Boston, MA. Aug. 23, 2010.

(56) References Cited

OTHER PUBLICATIONS

D'Souza et al., Directed Nucleation of Calcite at a Crystal-Imprinted Polymer Surface; Nature; 1999; 398 (6725); 312-316.
Dunitz et al., Disappearing Polymorphs. Acc Chem Res. 1995;28(4):193-200.
Erdemir et al., Nucleation of crystals from solution: classical and two-step models. Acc Chem Res. May 19, 2009;42(5):621-9. doi:10.1021/ar800217x.
Frenkel, Seeds of Phase Change; Nature; 2006; 443(12); 641.
Lavish et al., The role of crystal polarity in alpha-amino acid crystals for induced nucleation of ice. Science. May 8, 1992;256(5058):815-8.
Getsoian et al., One-solvent polymorph screen of carbamazepine. Int J Pharm. Feb. 4, 2008;348(1-2):3-9. Epub Oct. 22, 2007.
Grzesiak et al., Comparison of the four anhydrous polymorphs of carbamazepine and the crystal structure of form I. J Pharm Sci. Nov. 2003;92(11):2260-71.
Ha et al., Phase Behavior and Polymorphism of Organic Crystals Confined within Nanoscale Chambers. Cryst Growth Des. 2009;9(11):4766-77.
Ha et al., Polymorph Selectivity Under Nanoscopic Confinement; Journal of American Chemical Society; 2004; 126; 3382-3383.
Hall et al., The crystal structure of metanilic acid. Acta Cryst. 1965;18:301-6.
Hamilton et al., Manipulating crystal orientation in nanoscale cylindrical pores by stereochemical inhibition. J Am Chem Soc. Feb. 25, 2009;131(7):2588-96. doi: 10.1021/ja807193s.
Harada et al., Formation of highly ordered rectangular nanoparticle superlattices by the cooperative self-assembly of nanoparticles and fatty molecules. Langmuir. Jun. 2, 2009;25(11):6407-12. doi:10.1021/la900013r.
Henck et al., Disappearing and reappearing polymorphs. The benzocaine:picric acid system. J Am Chem Soc. Mar. 7, 2001;123(9):1834-41.
Hilden et al., Capillary Precipitation of a Highly Polymorphic Organic Compound. Cryst Growth Des. 2003:3(6):921-6.
Hillier et al., Epitaxial interactions between molecular overlayers and ordered substrates. Phys Rev B Condens Matter. Nov. 15, 1996;54(19):14037-14051.
Hiremath et al., Controlling molecular crystal polymorphism with self-assembled monolayer templates. J Am Chem Soc. Dec. 28, 2005;127(51):18321-7.
Hooks et al., Epitaxy and Molecular Organization on Solid Substrates. Adv Mat. Feb. 2001;13(4):227-41.
Jackson et al., Vitrification and Crystallization of Organic Liquids Confined to Nanoscale Pores; Chem. Mater.; 1996; 8; 2128-2137.
Kelly et al., Solvent Effects on the Crystallization and Preferential Nucleation of Carbamazepine Anhydrous Polymorphs: A Molecular Recognition Perspective. Org Process Res Dev. 2009;13(6):1291-300.
Lang et al., Form IV of carbamazepine. J Pharm Sci. Apr. 2002;91(4):1186-90.
Larhrib et al., Characterisation and deposition studies of engineered lactose crystals with potential for use as a carrier for aerosolised salbutamol sulfate from dry powder inhalers. Eur J Pharm Sci. Jul. 2003;19(4):211-21.
Last et al., The Physicochemical Origins of Coincident Epitaxy in Molecular Overlayers: Lattice Modeling vs Potential Energy Calculations. J Phys Chem. 1999:103(32):6723-33.
Lee et al., Crystallization on Confined Engineered Surfaces: A Method to Control Crystal Size and Generate Different Polymorphs; Journal of the American Chemical Society; 2005; 127(43); 14982-14983.
Levene, Note on the Preparation of crystalline d-mannose and of crystalline d-ribose. J Biol Chem. 1934;108(2):419-20.
Liberski et al., Screening for Polymorphs on Polymer Microarrays; Journal of Combinatorial Chemistry; 2008; 10(1); 24-27.
Maheshwari et al., Effect of Interfacial Hydrogen Bonding on the Freezing/Melting Behavior of Nanoconfined Liquids; J. Phys. Chem C.; 2010; 114; 4966-4972.
Nichols et al., Physicochemical characterization of the orthorhombic polymorph of paracetamol crystallized from solution. J Pharm Sci. Jun. 1998;87(6):684-93.
Nicholson et al., Stable Polymorphs Crystallized Directly under Thermodynamic Control in Three-Dimensional Nanoconfinement: A Generic Methodology. Cryst Growth Des. 2011;11(2):363-6.
Nokhodchi et al., Dissolution and mechanical behaviors of recrystallized carbamazepine from alcohol solution in the presence of additives. J Crystal Growth. Feb. 1, 2005;274(3-4):573-84.
Olmsted et al., The role of chemical interactions and epitaxy during nucleation of organic crystals on crystalline substrates. Cryst Eng Comm. 2011;13(4):1070-3.
Page et al., Crystallization controlled by the geometry of a surface. J Am Chem Soc. Dec. 9, 2009;131(48):17550-1. doi:10.1021/ja9085512.
Page et al., Heterogeneous nucleation in and out of pores. Phys Rev Lett. Aug. 11, 2006;97(6):065701. Epub Aug. 10, 2006.
Peppas et al., Hydrogels in Biology and Medicine: From Molecular Principles to Bionanotechnology. Adv Mat. Jun. 2006; 18(11):1345-60.
Price et al., Crystalline Polymorph Selection and Discovery With Polymer Heteronuclei; Journal of the American Chemical Society; 2005, 127(15); 5512-5517.
Rodríguez-Hornedo et al., Significance of controlling crystallization mechanisms and kinetics in pharmaceutical systems. J Pharm Sci. Jul. 1999;88(7):651-60.
Rubin-Preminger et al., 3-Aminobenzenesulfonic Acid: A Disappearing Polymorph. Cryst Growth Design. 2005;5(4):1343-9.
Santiso et al., A general set of order parameters for molecular crystals. J Chem Phys. Feb. 14, 2011;134(6):064109. doi:10.1063/1.3548889.
Savas et al., Large-area achromatic interferometric lithography for 100 nm period gratings and grids. Journal of Vacuum Science & Technology. 1996;B14:4167-70.
Singh et al., Concomitant Crystallization of ROY on Patterned Substrates: Using a High Throughput Method to Improve the Chances of Crystallization of Different Polymorphs. Cryst Growth Des. 2009;9(2):1182-5. doi:10.1021/cg801055x.
Steiner, Unrolling the hydrogen bond properties of C—H•••O interactions. Chem Commun. 1997:727-34.
Stewart et al., Imprint Materials for Nanoscale Devices. Mrs Bulletin. Dec. 2005;30(12):947-51.
Tanaka, Unusual Phase-Separation in a Polymer-Solution Caused by Asymmetric Molecular-Dynamics; Physical Review Letters; 1993; 71(19); 3158-3161.
Ten Wolde et al., Enhancement of protein crystal nucleation by critical density fluctuations. Science. Sep. 26, 1997;277(5334):1975-8.
Trujillo et al., Grafted Functional Polymer Nanostructures Patterned Bottom-Up by Colloidal Lithography and Initiated Chemical Vapor Deposition (iCVD). Chemistry of Materials. 2009;21:742-50.
Turnbull, Kinetics of heterogeneous nucleation. J Chem Phys. 1950;18:198-203.
Van Meel et al., Design principles for broad-spectrum protein-crystal nucleants with nanoscale pits. Phys Rev Lett. Nov. 12, 2010;105(20):205501. Epub Nov. 8, 2010.
Vekilov, Dense Liquid Precursor for the Nucleation of Ordered Solid Phases from Solution. Cryst Growth Design. 2004;4(4):671-85.
Ward, Bulk crystals to surfaces: combining X-ray diffraction and atomic force microscopy to probe the structure and formation of crystal interfaces. Chem Rev. Jun. 2001;101(6):1697-725.
Webb et al., Problems with crystals. J Chem Educ. 1978;55(10):644.
Xia et al., Monodispersed Colloidal Spheres: Old Materials with New Applications. Advanced Materials. May 2000;12(10):693-713.
Yin et al., Colloidal nanocrystal synthesis and the organic-inorganic interface. Nature. Sep. 29, 2005;437(7059):664-70.
Yu et al., Thermochemistry and Conformational Polymorphism of a Hexamorphic Crystal System. J Am Chem Soc 2000;122(4):585-91.
Yu, Polymorphism in molecular solids: an extraordinary system of red, orange, and yellowcrystals. Acc Chem Res. Sep. 21, 2010;43(9):1257-66. doi:10.1021/ar100040r.

(56) References Cited

OTHER PUBLICATIONS

Lee et al., Concomitant Crystallization of Glycine on Patterned Substrates: The Effect of pH on the Polymorphic Outcome. Crystal Growth & Design. Jan. 2008;8(1):108-13.

Singh et al., Concomitant Crystallization of ROY on Patterned Substrates: Using a High Throughput Method to Improve the Chances of Crystallization of Different Polymorphs. Crystal Growth & Design. Feb. 2009;9(2):1182-5.

* cited by examiner

View perpendicular to (0-11) plane

View along the (0-11) plane

View perpendicular to (00-1) plane

View along the (00-1) plane

METHODS AND SYSTEMS RELATING TO THE SELECTION OF SUBSTRATES COMPRISING CRYSTALLINE TEMPLATES FOR THE CONTROLLED CRYSTALLIZATION OF MOLECULAR SPECIES

RELATED APPLICATIONS

This application claims priority to U.S. Provisional Patent Application Ser. No. 61/559,772, filed Nov. 15, 2011, and entitled "Strategy for Selecting Crystalline Substrates to be used for the Heterogeneous Crystallization of Vanishing Polymorphic Forms and Selection of Other Polymorph Forms" to Chadwick et al., which is incorporated herein by reference in its entirety for all purposes.

FIELD OF THE INVENTION

The present invention generally relates to methods and systems relating to the selection of substrates comprising crystalline templates for the controlled crystallization of molecular species.

BACKGROUND OF THE INVENTION

The issue of polymorphism, different crystal structures of the same chemical entity, remains a significant challenge to the chemical community as a whole. In many areas of materials science, such as pharmaceuticals and semiconductors, being able to control and consistently obtain the desired polymorphic form is important as only one form may display the desired physicochemical properties. Therefore, the ability to reliably crystallize the required polymorphic form of a given compound has become essential. Despite significant resources invested by academia and industry to find solutions for controlling polymorphism, there are two significant areas in which control over polymorphism has not been achieved. They are (1) so called hard to crystallize polymorphs, also referred to as disappearing polymorphs, and (2) polymorphs predicted by computational methods that have never been observed experimentally. In the first case, hard to crystallize polymorphs refers to a scenario in which the original crystal form of a compound can no longer be crystallized once a new and more stable form has been obtained. In the second instance, computational methods predict a polymorphic form that is more stable than any observed in the laboratory. However, they cannot be obtained using conventional polymorph screening techniques.

Accordingly, new methods and systems are needed.

SUMMARY OF THE INVENTION

In some embodiments, methods for facilitating crystallization of a selected polymorphic form of a molecular species are provided comprising exposing a substrate comprising a crystalline template to a molecular species comprising a plurality of functional groups, wherein the template comprises on at least one surface comprising a plurality of complimentary functional groups to the functional groups of the molecular species, and wherein the template is selected to have a complimentary space group and unit cell dimension to the selected polymorphic form; and causing the molecular species to crystallize in the selected polymorphic form on at least a portion of the template, wherein the average induction time is decreased by a factor of at least three, under substantially similar conditions, as compared to the average induction time using a template not comprising the complimentary functional groups to the molecular species, the complimentary space group, and/or the complimentary unit cell dimension to the selected polymorphic form.

In some embodiments, methods for facilitating crystallization of a selected polymorphic form of a molecular species are provided comprising
selecting a polymorphic form of a molecular species and determining the space group, unit cell dimensions A×B×C, and the functional groups present on each face A, B, and C; selecting a substrate comprising a crystalline template, wherein the crystalline template comprises:
the same space group as the molecular species;
unit cell dimensions X×Y×Z, wherein X=A±(R×S), Y=B±(R×S); and Z=C±(R×S), wherein S is between 0 and 0.05 and R is the longest of A, B, and C; and
functional groups on at least one surface of the substrate which are complimentary to the functional groups of the molecular species on the corresponding surface; exposing the crystalline substrate to a solution comprising the molecular species; and causing the molecular species to crystallize on at least a portion of the substrate.

In some embodiments, systems for facilitating crystallization of a selected polymorphic form of a molecular species are provided comprising the molecular species comprising a plurality of functional groups; and a substrate comprising a crystalline template, wherein at least one surface of the template comprises a plurality of complimentary functional groups to the functional groups of the molecular species, and wherein the template comprises a complimentary space group and unit cell dimension to the selected polymorphic form.

In some embodiments, substrates to facilitate crystallization of polymorphs of a molecular species are provided comprising a crystalline composition having unit cell lengths:

$$X = A \pm (R \times S);$$

$$Y = B \pm (R \times S); \text{ and}$$

$$Z = C \pm (R \times S);$$

wherein R is the dimension of the longest cell axis of the polymorph to be crystallized and S is a tolerance factor and is $0 \leq S \leq 0.05$; a space group of the crystalline composition unit cell matching the polymorph to be crystallized and the crystalline composition contains at least one functional group present in the polymorph being crystallized; and wherein the crystalline composition is not soluble in the solvent(s) from which the polymorph is to be crystallized.

Figure 1:
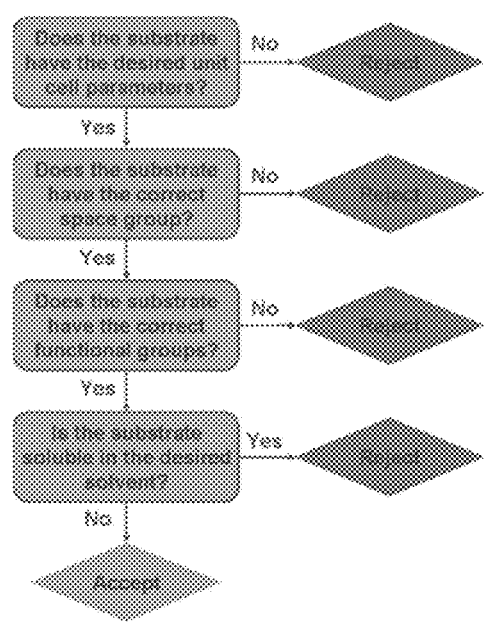
FIG. 1 shows a flow diagram for a substrate selection process, according to some embodiments.

Other aspects, embodiments, and features of the invention will become apparent from the following detailed description when considered in conjunction with the accompanying drawings. The accompanying figures are schematic and are not intended to be drawn to scale. For purposes of clarity, not every component is labeled in every figure, nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

The present invention generally relates to methods and systems relating to the controlled crystallization of molecular species (e.g., small organic molecules) on substrates comprising a crystalline template. In some embodiments, the methods and systems allow for the controlled crystallization of a molecular species in a selected polymorphic form. The subject matter of the present invention involves, in some cases, interrelated products, alternative solutions to a particular problem, and/or a plurality of different uses of one or more systems and/or articles.

According to some aspects of the present invention, methods and systems are provided for controlling the crystallization of molecular species, e.g. from a solution, by selecting a substrate on which the molecular species is to be crystallized based on a number of parameters. As will be known by those of ordinary skill in the art, crystallization generally comprises the stages of free solute molecules, formation of a disordered nucleus, and formation of an ordered nucleus, followed by formation of the crystal. Heterogeneous nucleation involves the use of an interface or surface at/on which nucleation can occur. The description provided herein describes how to select and/or vary a substrate (e.g., a material on which a molecular species is to crystallize) to affect the manner in which a molecular species crystallizes. Generally, the substrate comprises a crystalline template. The present invention recognizes that appropriate selection of the type of substrate (e.g., the chemical make-up of the substrate) as well as the crystalline parameters of the substrate (e.g., space group, unit cell dimensions, etc.) used to promote nucleation of a small organic molecule can lead to crystallization of the molecular species in a selected polymorphic form and/or improve crystallization kinetics (e.g., reduced induction time). The methods and/or systems described herein can be used affect the crystallization rate and/or the type of crystal structure formed (e.g., the polymorph). For example, in some embodiments, the present invention recognizes that selection of the substrate based on the surface functional groups, the space group, and the unit cell dimensions can lead to the crystallization of the particular polymorph and/or a reduced average induction time as compared to a similar substrate that does not have the surface functional groups, the space group, and/or the unit cell dimensions.

It should be understood that while many of the embodiments described herein discusses the use of a molecular species being a small organic molecule, this is by no way limiting and other molecular species may be employed (e.g., inorganic salts).

In some embodiments, methods and systems for facilitating crystallization of a selected polymorphic form of a molecular species are provided. In some embodiments, the methods and system comprise selected a substrate comprising a number of features which aid in the crystallization of the selected polymorphic form of the molecular species. As described in more detail herein, the features include use of a substrate which has a complimentary space group to the polymorph to be formed, complimentary unit cell dimensions to the polymorph to be formed, complimentary functional groups to the functional groups of the molecular species, and optionally, insolubility of the substrate in the solvent system employed for the crystallization. In some cases, selection of a substrate which includes all of these features allows for the crystallization of a molecular species in a selected polymorphic form, whereas a substrate which does not have all of the features would not promote the crystallization of the particular polymorphic form. FIG. 1 shows a flow diagram for a substrate selection process, according to some embodiments. In some cases, the methods and systems described herein allow for the crystallization of a molecular species in a disappearing polymorphic form. The term "disappearing polymorph" is given its ordinary meaning in the art and refers to a polymorphic crystal form of a molecular species which has been previously obtained but is now difficult, if not possible, to form, e.g., under the same conditions that it was previously able to be obtained. In some cases, the selected polymorphic form is metastable at the isolation temperature.

In some embodiments, a method for facilitating crystallization of a selected polymorphic form of a molecular species comprises exposing a substrate comprising a crystalline template to a molecular species comprising a plurality of functional groups. In some cases, the template comprises on at least one surface a plurality of complimentary functional groups to the functional groups of the molecular species, and the template is selected to have a complimentary space group and unit cell dimension to the selected polymorphic form. The molecular species may then be caused to crystallize in the selected polymorphic form on at least a portion of the template. In some cases, the average induction time is decreased by a factor of at least three, under substantially similar conditions, as compared to the average induction time using a template not comprising the complimentary functional groups to the molecular species, the complimentary space group, and/or the complimentary unit cell dimension to the selected polymorphic form.

In some embodiments, a method for facilitating crystallization of a selected polymorphic form of a molecular species comprises selecting a polymorphic form of a molecular species and determining the space group, unit cell dimensions A×B×C, and the functional groups present on each face A, B, and C. A substrate may then be selected, wherein the substrate comprises a crystalline template having the same space group as the molecular species; unit cell dimensions X×Y×Z, wherein X=A±(R×S), Y=B±(R×S), and Z=C±(R×S), wherein S is between 0 and 0.05 and R is the longest of A, B, and C; and functional groups on at least one surface of the substrate which are complimentary to the functional groups of the molecular species on the corresponding surface. The crystalline substrate may then be exposed to a solution comprising the molecular species and the molecular species may be caused to crystallize on at least a portion of the substrate.

In some embodiments, systems are provided for facilitating crystallization of a selected polymorphic form of a molecular species. In some cases, the system comprises the molecular species comprising a plurality of functional groups and a substrate comprising a crystalline template, wherein at least one surface of the template comprises a plurality of complimentary functional groups to the functional groups of the molecular species, and wherein the template comprises a complimentary space group and unit cell dimension to the selected polymorphic form.

In yet other embodiments, substrates are provided to facilitate crystallization of a polymorph of a molecular species. In some cases, the substrate comprises a crystalline composition having unit cell dimensions: X=A±(R×S); Y=B±(R×S); and Z=C±(R×S); wherein R is the dimension of the longest unit cell dimension of the polymorph to be crystallized and S is a tolerance factor and is 0≤S≤0.05. The substrate may also comprise a space group of the crystalline composition unit cell dimensions matching the polymorph to be crystallized and the crystalline composition contains at least one functional group present in the polymorph being crystallized. In addition, the crystalline composition may be insoluble in the solvent(s) from which the polymorph is to be crystallized.

Selection, control, and/or modification of the substrate material (e.g., which comprises a crystalline template or crystalline composition) will now be described in more detail. In some embodiments, the substrate comprises a material, wherein the material comprises a crystalline template. The term "crystalline," as used herein, is given its ordinary meaning in the art and refers to a material which exhibits uniformly arranged molecules or atoms. Methods of determining whether a material is crystalline are known in the art, for example, x-ray diffraction techniques. A substrate comprising a crystalline template refers to a substrate in which at least one surface is crystalline. In some embodiments, the crystalline template is selected so as to 1) have a complimentary space group as compared to the space group of the polymorph to be crystallized, 2) have complimentary unit cell dimensions as compared to the polymorph to be crystallized, and/or 3) comprise a plurality of complimentary functional groups on at least one surface of the substrate, wherein the functional groups are complimentary to functional group(s) of the molecular species.

In some embodiments, the space group of the crystalline template is complimentary to the space group of the polymorphic form of the molecular species to be crystallized. In some embodiments, the space group of the crystalline template is the same as the space group of the polymorphic form of the molecular species to be crystallized. The term "space group" is given its ordinary meaning in the art and refers to a group or array of operations consistent with an infinitely extended regularly repeating pattern. Generally, the space group is the symmetry of a three-dimensional structure, or the arrangement of symmetry elements of a crystal. There are approximately 230 known space groups.

In some embodiments, the unit cell dimensions of the crystalline template of the substrate are complimentary to the unit cell dimensions of the polymorphic form of the molecular species to be crystallized. The term "unit cell" is given its ordinary meaning in the art and refers to the portion of a crystal structure that is repeated infinitely by translation in three dimensions. Generally, a unit dimensions is characterized by three vectors (e.g., A, B, and C as used herein for the unit cell dimensions of the polymorph of the molecular species, or X, Y, and Z as used herein for the unit cell dimensions of the crystalline template), wherein the three vectors are not located in one plane and form the edges of a parallelepiped. Angles alpha, beta, and gamma define the angles between the vectors: angle alpha is the angle between vectors B and C or Y and Z, angle beta is the angle between vectors A and C or X and Z, and angle gamma is the angle between vectors A and B or X and Y. The entire volume of a crystal can be constructed by regular assembly of unit cells; each unit cell comprises a complete representation of the unit of pattern, the repetition of which builds up the crystal.

In some embodiments, the complimentary unit cell dimensions of the crystalline template are selected as follows. In the following description, the unit cell dimensions of the crystalline template has vectors X×Y×Z and the unit cell dimensions of the polymorph of the molecular species to be crystallized has vectors A×B×C. In some embodiments, vectors X, Y, and Z are selected so as to have a dimensions which are equal to or close to the dimensions of vectors A, B, and C, respectively. In some embodiments, the crystalline substrate is selected so that X=A±(R×S); Y=B±(R×S); and Z=C±(R×S), wherein S is a tolerance factor and R is the longest of A, B, and C. In some embodiments, S is between 0 and 0.1, or between 0 and 0.09, or between 0 and 0.08, or between 0 and 0.07, or between 0 and 0.06, or between 0 and 0.05, or between 0 and 0.04, or between 0 and 0.03, or between 0 and 0.02, or between 0 and 0.01. In one embodiment, S is between 0 and 0.05. In another embodiment, S is between 0 and 0.03.

Methods and systems for determining the space group and unit cell dimensions of a polymorph of the molecular species and/or of the crystalline template are known in the art. In some embodiments, the methods and systems comprise use of an x-ray diffraction techniques and related software. In some embodiments, a search for appropriate substrates with complimentary space groups and/or unit cell dimensions may be conducted using a structural database, for example, the Cambridge Structural Database (Cambridge Structural Database System, Cambridge Crystallographic Data Centre, Cambridge, UK).

In some embodiments, the substrate material may be selected such that at least one surface (e.g., comprising the crystalline template) of the substrate comprises a plurality of at least one type of functional group which is complimentary to at least one functional group of the small organic molecule. That is, the functional groups of the substrate may be selected so as interact with a specific functional group of the organic small molecule of interest. The selection of complimentary combinations of functional groups aid in the crystallization of the small organic molecule in 1) a particular crystal form (e.g., polymorph) and/or 2) with a faster induction time.

Without wishing to be bound by theory, selection of complimentary functional groups for the substrate (e.g., comprising the crystalline template) may aid in the formation of a particular polymorph of the small organic molecule due the preferential interactions between the portion of the small organic molecule having the function group and the substrate. The preferential interactions may cause the portion of the small organic molecule having the functional group to have a greater affinity for the surface of the substrate as compared to the other portions of the small organic molecule, thereby causing a plurality of the small organic molecules to associate with the substrate in a favored directional orientation. The alignment of a plurality of small organic molecules having the same approximate directional orientation can catalyze the nucleation/crystallization of the small organic molecule in a particular crystal phase. To determine which functional groups of the small organic molecule are present on the surface of at least one face/edge of the crystal form and a type of functional group complimentary to that can be selected to be present of the substrate surface, a known crystal structure may be examined.

Complimentary types functional groups (e.g., comprised on the surface of the substrate and the molecular species) will be known to those of ordinary skill in the art. The association may be based on formation of a bond, such as an ionic bond, a covalent bond (e.g., carbon-carbon, carbon-oxygen, oxygen-silicon, sulfur-sulfur, phosphorus-nitrogen, carbon-nitrogen, metal-oxygen, or other covalent bonds), a hydrogen bond (e.g., between hydroxyl, amine, carboxyl, thiol, and/or similar functional groups), a dative bond (e.g., complexation or chelation between metal ions and monodentate or multidentate ligands), Van der Waals interactions, or the like.

In some cases, the substrate material may be selected such that it comprises at least a plurality of hydroxyl functional groups, a plurality of carboxylic acid ester functional groups, a plurality of nitrogen containing base functional group, a plurality of aryl (e.g., phenyl) functional groups, a plurality of carboxyl functional group, a plurality of tertiary amide functional groups, or combinations thereof. As a non-limiting example, if the small organic molecule comprises an aryl group, the functional group on the surface of the substrate may be selected to be an aryl functional group, such that pi-interactions can occur between the surface of the substrate and the small organic molecule. As another example, if the small organic molecule comprises a hydrogen-bond donating group, the functional group on the surface of the substrate may be selected to be a hydrogen-bond accepting group. As a specific example, the small organic molecule may contain a carboxylic acid functionality and the surface of the substrate may contain a tertiary amide functionality. As another specific example, the small organic molecule may contain a carbonyl group and the surface of the substrate may contain a hydroxyl group. As yet another specific example, both the small organic molecule and the surface of the substrate may contain phenyl groups, and the interaction may be a pi-stacking interaction.

Suitable substrates for use in the methods and systems as described herein are known in the art. In some embodiments, the substrate may comprise a crystalline material. In some embodiments, the substrate comprises a material which is found in the Cambridge Structural Database. In some cases, the substrate is not soluble in the solution in which the crystallization is to occur. The crystallization substrate may be of any suitable shape, size, or form. In some cases, the substrate may be a planar surface and/or a portion of a container. Non-limiting examples of shapes include sheets, cubes, cylinders, hollow tubes, spheres, and the like. In some cases, the maximum dimension of the substrate in one dimension may be at least about 1 mm, at least about 1 cm, at least about 5 cm, at least about 10 cm, at least about 1 m, at least about 2 m, or greater. In some cases, the minimum dimension of the substrate in one dimension may be less than about 50 cm, less than about 10 cm, less than about 5 cm, less than about 1 cm, less than about 10 mm, less than about 1 mm, less than about 1 um, less than about 100 nm, less than about 10 nm, less than about 1 nm, or less.

In some embodiments, that average crystallization induction times can be decreased significantly in the arrangements described herein for improved crystallization, for example, utilizing a crystalline substrate with complimentary functional groups, complimentary space group, and complimentary unit cell dimensions, as compared to substrates not having those features. In some embodiments, the average induction time is reduced by a factor of at least 3 (or other factors described herein), under substantial identical conditions, as compared to the average induction time using a substrate substantially free of one or more (or all) of features described.

Methods and systems for determine the average induction time are known in the art. The term "induction time" is given its ordinary meaning in the art and refers to the time between supersaturation ($\sigma=(c-c_{eq})/c_{eq}$), wherein $\sigma$ is the supersaturation percent, c is the actual concentration, and $c_{eq}$ is the saturation concentration at the same temperature) being generated and nucleation occurring. In some embodiments, the average induction time may be determined by examining the percent transmission versus time during a crystallization, wherein a drop in the percent transmission indicates that nucleation/crystallization has begun. In some embodiments, the average induction time is determined by averaging the nucleation time for a large number of samples. In some cases, the average induction time is the average of the induction times determined for 2, 3, 4, 5, 6, 7, 8, 9, 10, 15, 20, 25, 30, 35, 40, 45, 50, 75, 100, or more, crystallizations carried out under substantially similar conditions.

Methods for determining the average induction time are known in the art. For example, in some embodiments, a set of substantially similar or identical vials or test tubes each containing substantially similar or identical solution of the same concentration may be prepared. These vials could be placed in a constant temperature bath and the temperature reduced so that the solution was supersaturated. Each vial could be observed (e.g., by eye, through a camera, or via light transmission) to determine when each vial formed crystals. A number of vials would be employed and the induction time would be determined as a mean and standard deviation.

Crystallization of molecular species (e.g., small organic molecules) may be carried out according to methods known to those of ordinary skill in the art. In some cases, a substrate (e.g., as described herein) may be exposed to a solution comprising a small organic molecule. Generally, the small organic molecule is substantially soluble in the solvent selected. In some cases, the solution comprising the solvent and the small organic molecule may be filtered prior to exposing the solution to the substrate. The small organic molecule may be present in the solvent at a concentration of about 0.05 M, about 0.1M, about 0.2 M, about 0.3 M, about 0.4 M, about 0.5 M, about 0.75 M, about 1 M, about 2 M, or greater. In some embodiments, a saturated or supersaturated solution of the small organic molecule is formed.

The crystallization may be carried out in any suitable solution (e.g., comprising one or more solvents). In some cases, the substrate is insoluble or substantially insoluble in the solvent system employed for the crystallization. Generally, the molecular species is soluble in the solvent system which is initially employed to form the solution comprising the molecular species. Non-limiting examples of solvents include water, acetone, ethanol, acetonitrile, benzene, p-cresol, toluene, xylene, mesitylene, diethyl ether, glycol, petroleum ether, hexane, cyclohexane, pentane, dichloromethane (methylene chloride), chloroform, carbon tetrachloride, dioxane, tetrahydrofuran (THF), dimethyl sulfoxide, dimethylformamide, hexamethyl-phosphoric triamide, ethyl acetate, pyridine, triethylamine, picoline, and combinations thereof.

Those of ordinary skill in the art will be aware of methods for inducing crystallization. For examples, in some cases, a system comprising a substrate and a solution comprising the small organic molecule may be cooled. Alternatively, the solution comprising the small organic molecule may be concentrated (e.g., by evaporation of at least a portion of the solvent). In some embodiments, a substrate selected according to the teachings herein may be exposed to a saturated or supersaturated solution of the molecular species. In some cases, the substrate is exposed to the solution comprising the molecular species by adding the solution to a container containing the substrate. In other embodiments, the substrate is added to the solution comprising the molecular species.

In some embodiments, the strategy for selecting crystalline substrates may be used for the heterogeneous crystallization of vanishing polymorphic forms and other polymorphic forms. In some embodiments, the methods and systems relate to selecting crystalline substrates for the controlled crystallization of hard to crystallize polymorphs, including so called "disappearing polymorphs". In some embodiments, the methods and systems relate to selecting crystalline substrates for the crystallization for computationally predicted low energy polymorphic forms not observed using other experimental techniques. In some embodiments, the methods and systems relate to 1) crystallization of vanishing polymorphs; 2) crystallization of predicted lowest energy forms; 3) crystalline substrate which have unit cell parameters within a specific tolerance of unit cell parameters (e.g., within 3% of the longest cell axis); 4) unit cell of substrate must the in the same space group as that of the desired polymorph; 5) substrate molecule having at least one functional group in common with target compound; and/or 6) substrate being insoluble in the solvent from which the desired polymorphic for will be crystallized. In some embodiments, methods/systems relating to crystalline substrates that crystallize these hard to crystallize polymorphs of a given compound are provided. In some embodiments, methods/systems of selecting such crystallize substrates are provided. In some embodiments, the crystalline substrates comprises four elements: 1) where the desired polymorphic form possesses unit cell lengths A, B, and D then the unit cell dimensions of the substrate (X, Y, and Z) fall within the range given as follows: $X=A\pm(R\times X)$, $Y\pm B+(R\times S)$, and $Z=C\pm(R\times S)$, wherein R is the dimension of the longest cell axis of the polymorph being crystallized (A, B, and C) and S is the tolerance factor (e.g., $0 \leq S \leq 0.05$); 2) the space group of the substrate unit cell matches the polymorph to be crystallized; 3) the substrate compound contains at least one functional group present in the compound being crystallized; and 4) the substrate must is not soluble in the solvent(s) from which the polymorphic form is to be crystallized.

The methods and/or compositions of the present invention may find application relating to pharmaceutical compositions and/or methods, wherein the molecular species is a pharmaceutically active agent. As will be known to those of ordinary skill in the art, different polymorphs of pharmaceutically active agents can have significantly different properties including solubility, bioavailability, conductivity, dissolution, mechanical properties, solubility, and/or stability. In particular, polymorphism in the pharmaceutical industry can have implications for bioavailability, downstream manufacturing processes, and meeting the necessary regulatory requirements. Accordingly, the ability to control the formed polymorph of the pharmaceutically active agent (e.g., using the methods and systems described herein) provides the advantage of having the capability to form a selected polymorph based on the properties of the substrate. In addition, the methods and systems described herein may provide access to polymorphs which are challenging to form, due to instability. In some embodiments, the methods and/or systems described herein may be employed to crystallize a molecular species in a disappearing polymorph.

The term "small molecule" is art-recognized and refers to a molecule which has a molecular weight of less than about 2000 g/mole, or less than about 1000 g/mole, and even less than about 500 g/mole. Small molecules may include, for example, nucleic acids, peptides, polypeptides, peptide nucleic acids, peptidomimetics, carbohydrates, lipids or other organic (carbon containing) or inorganic molecules. The term "small organic molecule" refers to a small molecule that is often identified as being an organic or medicinal compound, and does not include molecules that are exclusively nucleic acids, peptides, or polypeptides. In some cases, the small organic molecule is a pharmaceutically active agent (i.e., a drug). A pharmaceutically active agent may be any bioactive agent. In some embodiments, the pharmaceutically active agent may be selected from "Approved Drug Products with Therapeutic Equivalence and Evaluations," published by the United States Food and Drug Administration (F.D.A.) (the "Orange Book"). In a particular embodiment, the pharmaceutically active agent is acetaminophen or 4-methoxy-6-methylpyrimidine.

In some embodiments, the molecular species crystallized using the methods and systems described herein may be used in "pharmaceutical compositions" or "pharmaceutically acceptable" compositions, which comprise a therapeutically effective amount of the crystallized molecular species formulated together with one or more pharmaceutically acceptable carriers, additives, and/or diluents. The pharmaceutical compositions described herein may be useful for diagnosing, preventing, treating or managing a disease or bodily condition in a subject. The phrase "pharmaceutically acceptable" is employed herein to refer to those structures, materials, compositions, and/or dosage forms which are, within the scope of sound medical judgment, suitable for use in contact with the tissues of human beings and animals without excessive toxicity, irritation, allergic response, or other problem or complication, commensurate with a reasonable benefit/risk ratio.

The phrase "pharmaceutically-acceptable carrier" as used herein means a pharmaceutically-acceptable material, composition or vehicle, such as a liquid, gel or solid filler, diluent, excipient, or solvent encapsulating material, involved in carrying or transporting the subject compound, e.g., from a device or from one organ, or portion of the body, to another organ, or portion of the body. Each carrier must be "acceptable" in the sense of being compatible with the other ingredients of the formulation and not injurious to the patient. Some examples of materials which can serve as pharmaceutically-acceptable carriers include: sugars, such as lactose, glucose and sucrose; starches, such as corn starch and potato starch; cellulose, and its derivatives, such as sodium carboxymethyl cellulose, ethyl cellulose and cellulose acetate; powdered tragacanth; malt; gelatin; talc; excipients, such as cocoa butter and suppository waxes; oils, such as peanut oil, cottonseed oil, safflower oil, sesame oil, olive oil, corn oil and soybean oil; glycols, such as propylene glycol; polyols, such as glycerin, sorbitol, mannitol and polyethylene glycol; esters, such as ethyl oleate and ethyl laurate; agar; buffering agents, such as magnesium hydroxide and aluminum hydroxide; alginic acid; pyrogen-free water; isotonic saline; Ringer's solution; ethyl alcohol; pH buffered solutions; polyesters, polycarbonates and/or polyanhydrides; and other non-toxic compatible substances employed in pharmaceutical formulations.

As used herein, a "subject" or a "patient" refers to any mammal (e.g., a human), for example, a mammal that may be susceptible to a disease or bodily condition. Examples of subjects or patients include a human, a non-human primate, a cow, a horse, a pig, a sheep, a goat, a dog, a cat, or a rodent such as a mouse, a rat, a hamster, or a guinea pig. Generally, the invention is directed toward use with humans. A subject may be a subject diagnosed with a certain disease or bodily condition or otherwise known to have a disease or bodily condition. In some embodiments, a subject may be diagnosed as, or known to be, at risk of developing a disease or bodily condition.

The following is incorporated by reference in its entirety for all purposes: U.S. Provisional Patent Application Ser. No. 61/559,772, filed Nov. 15, 2011, and entitled "Strategy for Selecting Crystalline Substrates to be used for the Heterogeneous Crystallization of Vanishing Polymorphic Forms and Selection of Other Polymorph Forms" to Chadwick et al.

The following examples are intended to illustrate certain embodiments of the present invention, but do not exemplify the full scope of the invention.

Example 1

This example describes the crystallization of Form I of 3-aminobenzenesulfonic acid (3-ABSA). Form I of 3-ABSA is an example of a so called "disappearing polymorph". It was crystallized in 1965 but since then attempts to crystallize it have only lead to the discovery of two new polymorphs known as Forms II and III. In this example Form I was crystallized from aqueous solutions using a crystalline substrate. The unit cell parameters of Form II are A=8.5, B=11.94, and C=6.76. Therefore when R=11.94 (the longest of A, B, and C) and S=0.03 (the selected tolerance factor for this example), the desired unit cell ranges for the crystalline substrates were A=8.14-8.86, B=11.58-12.3, and C=6.4-7.12. These parameters were used to search the Cambridge Structural Database for crystal structures whose unit cell parameters fell within the specified range. Next, all those structures whose unit cell did not conform to the space group Pnam (the space group of Form I for 3-ABSA) were eliminated as candidates. Then applying the third element, all candidates whose molecular functionalities did not include an amine group were eliminated. Finally, all substrates soluble in water were removed. From the remaining candidates, 2-amino-4-methoxy-6-methylpyrimidine (AMMP) was chosen as the substrate. Crystallizations from solution were performed with and without the presence of the substrate. Without AMMP only Form II was obtained. However, when the crystallizations were repeated in the presence of AMMP, Form I crystallized.

Example 2

This example describes a method for selecting crystalline substrates to control polymorphism by heterogeneous nucleation of acetaminophen.

Polymorphism, which can be simply defined as different crystal structures of the same chemical entity, has been well studied for almost 200 years. Subtle changes in both intra and intermolecular interactions between polymorphic forms can lead to marked differences in the physicochemical properties of a material such as bioavailability, chemical stability, and solid state stability. It is desirable to develop techniques in order to screen for all crystal forms of the target compound and strategies for selectively crystallizing the polymorph with the desired properties. In order to achieve these aims, it is important to understand the mechanisms controlling polymorphism.

Acetaminophen (AAP) has two well characterized polymorphs, the monoclinic and orthorhombic forms, also referred to as Forms I and II respectively. Form I is the thermodynamically stable phase under ambient conditions. The crystal structures for both polymorphs are known. More recently the crystal structure of a third polymorph, known as Form III, was determined. However it has been shown to be highly unstable in air and has only been crystallized in confined environments. Form II was first obtained by evaporation from ethanol in 1974. Since then subsequent studies have demonstrated the difficulty in crystallizing Form II from solution. When seeding with Form II, Form I may crystallize within 15 minutes via solvent mediated phase transformation. Above 60° C., Form II undergoes a solid state transformation to Form I. More recently, the use of polymer hetero nuclei has been show to lead to the crystallization of Form II from aqueous solutions. Still, little mechanistic insight was provided as to why particular polymers were successful at promoting the nucleation of Form II although the authors postulate that the molecular functionality of the polymer played a significant role in determining the polymorphism. In this example, use of a new method for selecting a three dimensional crystalline substrate whose purpose is to selectively crystallize Form II from solution under conditions which typically yield Form I is described. This example describes possible mechanisms responsible for controlling heteroepitaxy on three dimensional crystalline substrates which allows for the rational design and selection of crystalline surfaces to control nucleation and hence polymorphism.

When crystallizing AAP from ethanol using a supersaturation ($\sigma=(c-c_{sat})/c_{sat}$) of 0.49 (supersaturation with respect to Form I), only Form I was obtained even though the solution is supersaturated with respect to both polymorphs. Such an observation implies that for both polymorphs their nucleation rate constants follow the relationship $k_I > k_{II}$. It was hypothesized crystalline substrates would be able to selectively crystallize Form II if they fit the following two core criteria: 1) the unit cell parameters of the substrate were substantially similar to that of Form II and 2) the molecular functionality of the compound acting as the substrate is similar to that of AAP. By constraining the crystallographic properties of the substrate in this way, a three dimensional lattice match with Form II was targeted. Furthermore, selection of compounds with similar functionality as AAP was selected to stabilize the formation of a nucleus through favorable interactions such as hydrogen bonds. By meeting these criteria, the kinetics of Form II was sufficiently enhanced as to overtake those of Form I, therefore allowing Form II to be selectively crystallized from conditions.

TABLE 1

Unit cell parameters for Form II AAP and corresponding CSD search range

| Unit Cell Axis | Form II (Å) | CSD Search Range (Å) |
|---|---|---|
| a | 17.1657 | 16.6507-17.6807 |
| b | 11.7773 | 11.2623-12.2923 |
| c | 7.212 | 6.697-7.727 |

In order to find suitable candidate substrates, the Cambridge Structural Database (CSD—Version 5.31, November 2009) was searched for all structures whose unit cell parameters were a close match to those of Form II. This was done using ConQuest 1.12. A 3% tolerance of the longest cell dimension of Form II was used to give a range of acceptable unit cell dimensions (Table 1). The search yielded 479 crystal structures whose unit cell parameters fell within the specified range. All structures whose space group was not Pbca (space group of Form II) were removed. The list of candidate structures was reduced further by rejecting all structures whose molecular functionality did not include C=O, N—H or O—H functional groups. Finally, all candidates soluble in ethanol, the solvent in which the crystallizations will be carried out, were discarded. A flow diagram depicting the substrate selection method is shown in FIG. 1. This left one suitable candidate substrate, 4-aminophenylacetic acid (4-APAA).

The crystallizations of AAP from ethanol were then repeated in the presence of 50 mg of 4-APAA seeds, added after the desired supersaturation had been achieved. Once crystallization occurred, the crystals were filtered immediately and analyzed by DSC and x-ray powder diffraction. DSC analysis of AAP crystallized in the presence of 4-APAA (FIG. 2h) showed the onset of melting to be 155.1° C., which is consistent with the melting point of pure Form II. Furthermore no melting endotherm for Form I which is often observed in DSC traces of apparently pure Form II. The x-ray diffraction data also confirmed that Form II crystallized when using 4-APAA as a substrate (FIG. 3), as the data is in good agreement with a diffraction pattern of Form II calculated in Mercury 2.4 from crystal structure data (CSD ref code: HXACAN08). However the diffraction pattern also contains small peaks corresponding to Form I. This suggests that there was a small amount of solvent mediated phase transformation from Form II to Form I either in a) solution prior to the crystals being filtered or b) storage due to residual traces of the mother liquor being present as a consequence of insufficient drying of the Form II crystals.

Figure 2:
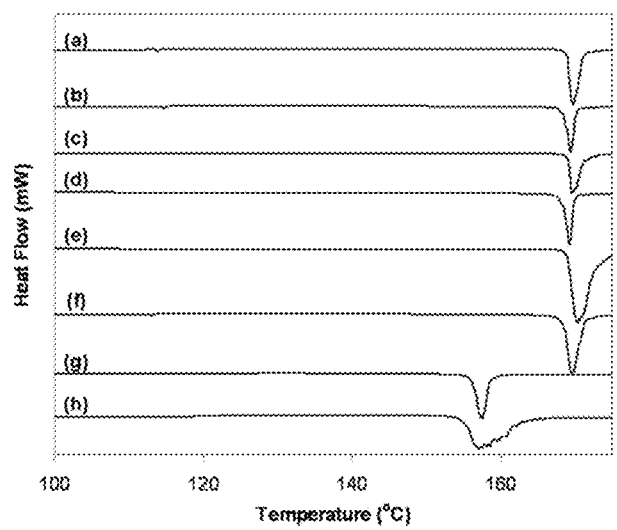
FIG. 2 shows DSC data for acetaminophen (AAP) crystallizations for: a) reference trace of Form I from pure ethanol; b) with graphite; c) with L-histidine; d) with α-lactose monohydrate (α-LMH); e) with D-mannitol; 0 with sodium chloride; g) reference trace of Form II; and h) with 4-aminophenylacetic acid (4-APAA), according to some embodiments.
Figure 3:
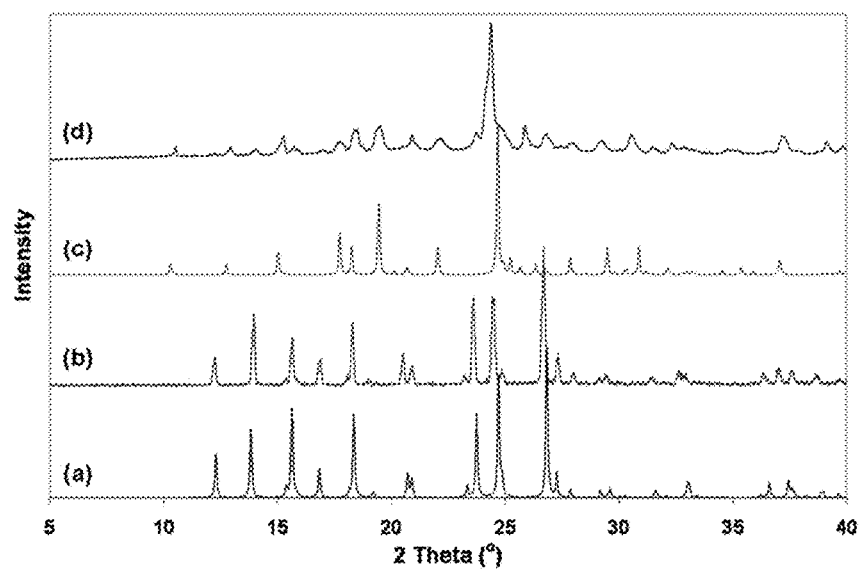
FIG. 3 shows x-ray powder diffraction data (XRPD) for: a) calculated Form I AAP; b) AAP crystallized from pure ethanol; c) calculated Form II AAP; and d) AAP crystallized in the presence of 4-APAA, according to some embodiments.

In order to show that this crystallization behavior was a combined effect of the 3D lattice and functionality matching, the crystallizations were then repeated using substrates that only exhibit one or none of the two core criteria. α-lactose monohydrate (α-LMH) and D-mannitol were chosen for their hydroxyl group functionality, graphite for its two-dimensional co-incident lattice match (determined using EpiCalc 5.023,24) with the fastest growing face of Form II and sodium chloride for its complete lattice mismatch and differing functionality. A plot of dimensionless potential energy ($V/V_0$) as a function of orientation angle (θ) for the interacting (001) faces of Form II acetaminophen and graphite was prepared. The EpiCalc calculation was performed using the following lattice values for the (001) faces of Form II acetaminophen and graphite: (001) Form II acetaminophen: a=17.1657 Å, b=11.7773 and Å and β=90° (001); graphite: a=b=2.456 Å and α=90°. The acetaminophen overlayer dimensions were 25×25 cells and the orientation angle range tested was 180° with a step size of 0.25°. The plots showed that the minimum value of $V/V_0$=0.6861 when 0=0 and 90°. The DSC data shows that the onset of the melting endotherm of AAP crystallized from ethanol solutions using these substrates is a good match with the known melting point of Form I (FIGS. 2b, c, d, e, and f).

These results suggest that selection of a crystalline substrate with similar unit cell parameters and molecular functionality to Form II, polymorphic control over AAP be achieved. Furthermore, it is possible to postulate a mechanism for the heterogeneous nucleation of Form II on 4-APAA substrate crystals in which the pre-nucleation aggregate is stabilized by epitaxial ordering directed by lattice matching and favorable intermolecular interactions between the aggregate and substrate surface. This epitaxial ordering may result in a significant decrease in the free energy barrier to nucleation of Form II and enhance the nucleation kinetics of Form II such that $k_{II} > k_I$. However, those substrates that do not fit the proposed criteria, outlined in FIG. 1, were not be able to achieve the epitaxial ordering of the pre-nucleation aggregate necessary to enhance the nucleation of Form II and therefore $k_I > k_{II}$.

In conclusion, by choosing a crystalline substrate for its crystallographic and functional similarity to a desired polymorphic form, selective crystallization of Form II of AAP was achieved, a polymorph that has previously proven difficult to crystallize from solution.

Example 3

The means to reliably control the crystal structure, or polymorphism, of a compound remains one of the most significant challenges in solid state chemistry. From food production to pharmaceutical manufacturing, the need to consistently obtain the desired crystal form is important, due to the marked differences in material properties, such as bioavailability and chemical and physical stability, which may arise from using different polymorphs. Indeed there are numerous documented instances of compounds whose original crystal form can no longer be obtained after the discovery of a more stable polymorph, even when the experimental conditions used to crystallize the original polymorph are replicated. Such elusive crystal forms are often referred to as 'disappearing' polymorphs.

The two most common explanations for the disappearance of these polymorphs are; 1) unintentional seeding of the crystallizer with the new polymorph and 2) crystallization kinetics. In case (1), it is believed that once the new crystal form has been obtained, seeds contaminate the laboratory/manufacturing site and hence contaminate subsequent crystallizations. Potential solutions have included replacing 'contaminated' equipment and personnel and even going as far as to open a new laboratory at a suitable distance from the old site. In case (2), it has been suggested that changes to the experimental conditions, such as the stirring speed, cooling rate or the impurity profile of the solution (i.e. the removal or addition of an impurity due to a change in the chemical synthesis route) may make the new form kinetically favorable. Examples of this impurity effect on polymorphism include progesterone and the well documented case of Ritonavir. The ability to develop reliable methods for recovering these elusive crystal forms has so far proven difficult.

Figure 4:
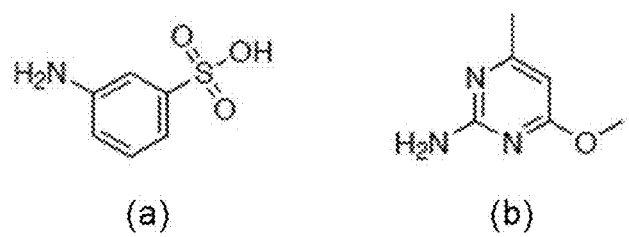
FIG. 4 shows the structures of a) 3-aminobenzenesulfonic acid and b) 2-amino-4-methoxy-6-methylpyrimidine.

In order to demonstrate the utility of crystalline substrates in rediscovering these 'lost' polymorphs, the crystallization of 3-aminobenzenesulfonic acid (3-ABSA, FIG. 4a) from aqueous solutions was studied. The original crystal structure, coined Form I, was determined in 1965 (unit cell parameters found in Table 2). Thereafter, the polymorphism of 3-ABSA was not studied again until 2005 when Form I was not obtainable using the original method. Despite considerable effort, two new crystal forms were formed, denoted as Forms II and III, with Form II determined to be the thermodynamically most stable form under ambient conditions. Hence Form I was labeled as a 'disappearing' polymorph. Again in 2006, only Form III was crystallized from ethanol-water under reflux.

TABLE 2

Unit cell dimensions of Form I 3-ABSA and CSD unit cell search parameters.

| Unit Cell Axis | Axis Length (Å) | CSD search range (Å) |
| --- | --- | --- |
| a | 8.5 | 8.142-8.858 |
| b | 11.944 | 11.586-12.302 |
| c | 6.756 | 6.398-7.114 |

Figure 5:
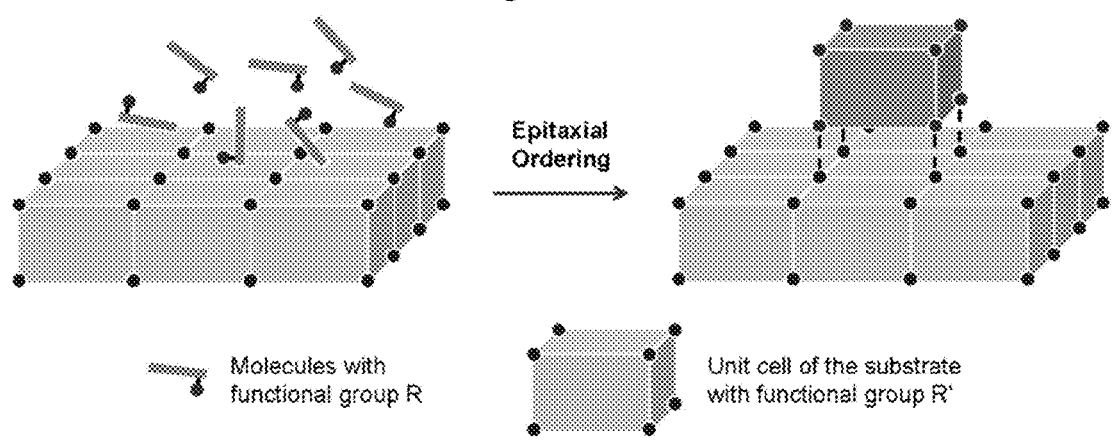
FIG. 5 shows a depiction of the epitaxial ordering of a pre-nucleation aggregate on a crystalline substrate surface, according to some embodiments.

The criteria used for selecting a crystalline substrate to preferentially nucleate and grow Form I of 3-ABSA are as follows. First, as Form I possesses the unit cell lengths A, B and C the unit cell dimensions of the substrate (X, Y, and Z) had to fall within the range given by the following equations:

$$X = A \pm (R \times S)$$

$$Y = B \pm (R \times S)$$

$$Z = C \pm (R \times S)$$

where R is the dimension of the longest cell axis of Form I (A, B or C). S is the tolerance factor, $0 \leq S \leq 0.05$, and determines the maximum allowable mismatch between the two cells. Second, the space group of the substrate unit cell had to match that of Form I. Third, the substrate compound had to contain at least one functional group (R') capable of forming hydrogen bonds to a functional group (R) present on 3-ABSA. Finally, the substrate had to be insoluble in the solvent(s) from which 3-ABSA was crystallized. The rationale behind selecting substrates with such specific unit cell parameters and functional groups is to direct prenucleation aggregates formed at the substrate surface to adopt a structure resembling that of Form I through precise intermolecular interactions and stabilize it such that it can grow into a mature crystal. A qualitative representation of the desired heteroepitaxial effect is shown in FIG. 5.

Initially Form I was targeted by repeating the methodology used previously. However when X-ray powder diffraction data (XRPD) of the resulting solid was compared to diffraction data calculated from single crystal data for the different polymorphs, it was determined that Form II had crystallized.

Using the substrate selection process outlined above, the Cambridge Structural Database (version 5.33) was searched for potential substrates whose unit cell parameters fell within the search range given in Table 2 (where R=11.944 Å and S=0.03). From this search 2-amino-4-methoxy-6-methylpyrimidine (AMMP) was selected as the candidate substrate (FIG. 4b) as in addition to having the required cell parameters, it shares the same space group as Form I (Pnam), contains an amine group like 3-ABSA, and is insoluble in water.

Figure 6:
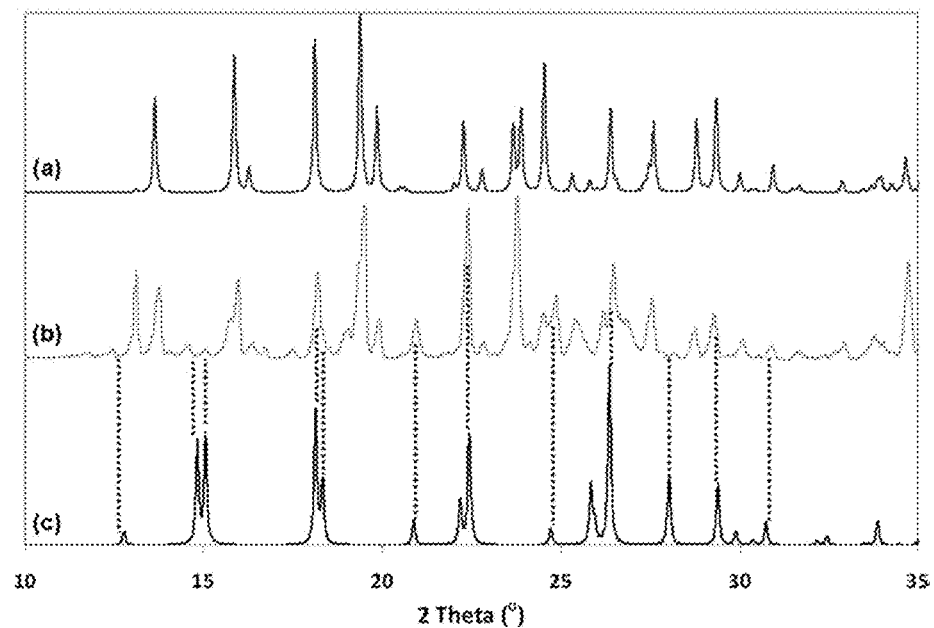
FIG. 6 shows XRPD data for: (a) calculated diffraction pattern Form II (CSD ref code: ANISAC01); (b) experimental data collected for 3-aminobenzenesulfonic acid (3-ABSA) crystallized from water in the presence of 2-amino-4-methoxy-6-methylpyrimidine (AMMP); and (c) calculated diffraction pattern Form I (ANISAC), according to some embodiments.

First, an aqueous solution of 3-ABSA saturated at 50° C. (27 mg/g water) was prepared and then cooled to 10° C. Once crystallization occurred the resulting slurry was immediately filtered and the solid analyzed by XRPD. Analysis of the diffraction data showed that Form II had crystallized. The experiment was then repeated, but this time when the solution temperature reached 10° C., 50 mg of AMMP seeds were added to the crystallizer. As before, once crystallization occurred the slurry was immediately filtered and analyzed by XRPD. FIG. 6 shows the diffraction data for 3-ABSA crystallized in the presence of AMMP. The diffraction data clearly shows major peaks corresponding to Form I, as indicated by the dashed lines. There are also peaks corresponding to Form II. Other small peaks in the experimental data correspond to AMMP. This seeding crystallization was repeated several times to ensure reproducibility of the result and in all cases a mixture of Forms I and II was obtained. The presence of a mixture of polymorphs suggests that either a significant amount of solvent mediate phase transformation, Form I→Form II occurred prior to analysis or that Form II nucleated from the bulk solution during crystallization.

These results show that by carefully selecting a substrate with the correct crystallographic and chemical properties, it was possible to direct the heteroepitaxy of 3-ABSA so that nucleation of Form I was possible from conditions favorable to the nucleation and crystal growth of Form II. In turn this implies that Form I has remained elusive for nearly 60 years due to experimental conditions used by previous researchers making Forms II and III more kinetically favorable.

To summarize, the use of rationally designed crystalline heterosurfaces for the nucleation of a "disappearing" polymorph has been demonstrated. This method provides a tool box for selecting substrates which can be successfully used to enhance the nucleation kinetics of the desired polymorphic form even when the experimental conditions have been altered such that they kinetically favor nucleation of a different polymorph. Controlling nucleation through precise heteroepitaxial mechanisms may be beneficial in many areas of solid state chemistry, particularly those where control over material properties is required.

Example 4

This example provides some mechanism insight into the choice of substrate based on the functional groups present on the surface of the substrate.

The rational design of crystalline surfaces for controlling nucleation and crystal growth via heteroepitaxial mechanisms is of great importance in the manufacture of advanced functional materials, such as pharmaceuticals and semiconductors. Despite numerous studies investigating the singular effect of crystalline lattice matching, molecular functionality or topography on epitaxial ordering, no study has been carried out investigating these effects in competition with one another in order to establish which effect is the most significant in promoting nucleation. This example described results and conclusions from studying the heterogeneous crystallization of the stable polymorph of acetaminophen (AAP) on crystalline substrates with differing lattice parameters and surface functionalities. Induction time measurements were used to rank the ability of the different substrates in promoting heterogeneous nucleation. In some embodiments, the results indicate that nucleation was preferred on substrates whose surface functionality matched with that of AAP, and that lattice matches with specific AAP crystal faces were also important. Furthermore through the use of single crystal X-ray diffraction and molecular modelling, the epitaxial ordering of AAP on single crystals of α-lactose monohydrate (α-LMH) and D-mannitol was investigated, in part, to gain mechanistic insight into the nucleation process.

This example describes results and conclusions from a study into the nucleation of the stable polymorph of acetaminophen (AAP) on crystalline substrates with differing lattice parameters and surface functionalities. The aim of these experiments was to enhance understanding as to how functional groups influence epitaxy and nucleation and to determine whether lattice matching or surface functionality is more influential in promoting the nucleation of AAP. Using nucleation induction time measurements to assess the effectiveness of each substrate this study indicates that nucleation of AAP was preferential on substrates whose surface functionality and hydrogen bonding preferences matched with those of AAP. Furthermore through single crystal X-ray diffraction and the use of lattice match analysis software it will be shown that incommensurate AAP/substrate systems with the correct surface functionality are able to promote nucleation then systems that exhibit co-incident epitaxy but have a poor surface functionality match. Finally, molecular modelling was used to gain insight into the possible mechanism responsible for the epitaxial ordering of AAP on two crystalline substrates, α-LMH and D-mannitol.

Methods

Materials:

AAP, graphite, D-mannitol, L-histidine and sodium chloride were all purchased from Sigma-Aldrich with purities of 99, 98, 99, 99 and 99.5% respectively. α-LMH was purchased from Emprove with a purity of 99%. Ethanol was purchased from Pharmco-Aaper (absolute, 200 proof).

Induction Time Analysis:

A stock solution of AAP in ethanol was prepared (232.75 g/kg—saturated at 30° C.). 1.5 mL aliquots of the stock solution were then syringe filtered into HPLC vials through a 0.2 μm nylon membrane in order to remove solid impurities. Crystallisations were carried out using a RS10 Clarity Solubility Station with non-intrusive infrared transmission probes and Integrity Client Software. The vials were initially held for 30 mins at 40° C. to ensure complete dissolution of AAP had occurred. After which they were cooled to 15° C. at a rate of 5° C./min and held at this temperature over a 24 hour period whilst the turbidity of the solution was monitored. Over the course of the experiments the stirring speed in each vial was held constant at 700 rpm. For those crystallizations requiring substrate, 3 mg was used. In each case the substrate had a crystal size ranging from approximately 10-200 μm. For each system studied 50 crystallisations were carried out to ensure a sufficient number of data points were obtained for statistical analysis.

Single Crystal X-Ray Diffraction Study of AAP/α-LMH and AAP/D-Mannitol Systems:

Single crystals of the β polymorph of D-mannitol were grown from water by evaporation (D-mannitol concentration—196.17 g/kg water). α-LMH single crystals were grown using the method described previously (e.g., see Larhrib H., Martin G. P., Prime D., Marriott C.; Eur. J. Pharm. Sci.; 2003; 19; 211). Acetone was added to an aqueous solution of lactose (concentration—0.1 g/g water) until the ratio by volume of acetone to water was 13:7. Without agitating the resulting supersaturated solution single crystals of α-LMH were observed after several hours. Single crystals of AAP were then grown onto the substrate crystals by placing them into AAP/ethanol solutions (saturation temperature—30° C., solution volume~1.5 mL) and inducing supersaturation by allowing the solutions to cool slowly to ambient temperature, ~20° C. All crystallizations were carried out without stirring. The substrate crystals were then recovered from solution by filtration and analysed by optical microscopy to ensure the presence of bound AAP/substrate crystals. The samples were then analysed by single crystal X-ray diffraction.

Low-temperature diffraction data were collected on a Siemens Platform three-circle diffractometer coupled to a Bruker-AXS Smart Apex CCD detector with graphite-monochromated Mo Kalpha radiation (lambda=0.71073 Å), performing omega-scans. Unit cell parameters and orientation matrices for the individual components were determined with the program cell_now, crystal faces were determined using the face-indexing plug-in of APEX2.

Other Data:

X-ray diffraction data was collected for (a) AAP Form I simulated in Mercury 2.4 (b) AAP from pure ethanol (c) AAP crystallized in the presence of α-lactose monohydrate (d) AAP crystallized in the presence of D-mannitol (e) AAP crystallized in the presence of graphite (f) AAP crystallized in the presence of L-histidine and (g) AAP crystallized in the presence of sodium chloride. The diffraction pattern was simulated in Mercury 2.4 using CIF file found in Cambridge Structural Database (REF Code: HXACAN07).

A plot of dimensionless potential energy ($V/V_0$) as a function of orientation angle (θ) for a) (0-11) face of acetaminophen and (0-11) face of α-lactose monohydrate and b) (100) face of acetaminophen and (00-1) of D-mannitol was prepared. The EpiCalc calculations were performed using the following lattice values for the (0-11) and (100) faces of Form I acetaminophen, the (0-11) face of α-lactose monohydrate and the (00-1) face of D-mannitol: (0-11) Form I acetaminophen: a=14.84 Å, b=7.09 Å and β=96.12°; (100) Form I acetaminophen: a=11.62 Å, b=9.23 Å and β=90°; (0-11) α-lactose monohydrate: a=15.19 Å, b=9.57 Å and α=95.85°; (00-1) D-mannitol: a=16.9 Å, b=8.69 Å and α=90°. The acetaminophen overlayer dimensions were 25×25 cells and the orientation angle range tested was 180° with a step size of 0.25°. A plot of dimensionless potential energy ($V/V_0$) as a function of orientation angle (θ) for a) (100) face of acetaminophen and (002) face of graphite and b) (0-11) face of acetaminophen and (002) of graphite was prepared. The EpiCalc calculations were performed using the following lattice values for the (100) and (0-11) faces of Form I acetaminophen and the (002) face of graphite: (100) Form I acetaminophen: a=11.62 Å, b=9.23 Å and β=90°; (0-11) Form I acetaminophen: a=14.84 Å, b=7.09 Å and β=96.12°; (002) graphite: a=b=2.456 Å and α=120°; The acetaminophen overlayer dimensions were 25×25 cells and the orientation angle range tested was 180° with a step size of 0.25°.

Molecular Modelling of Epitaxial Ordering

Force Field Validation for AAP, α-LMH, and D-Mannitol:

AAP Form I was modeled using the CHARMM36 general force field for small drug-like molecules whilst the CHARMM36 carbohydrate force field was applied to α-LMH and D-mannitol. The water within the α-LMH structure was modeled using the TIP3P force field. Crystal supercells were built and equilibrated using molecular dynamics at 298K and 1 atm for 1 ns with periodic boundary conditions. The particle mesh Ewald summation method was used to correct for the long range electrostatic interactions. After that, percentage change of lattice parameters (PLCP) and root mean squared differences (RMSD), compared to the experimental X-ray structures, were calculated using the structures sampled in the next 0.5 ns run, with a sampling interval of 1 ps. The results can be found in the supplementary information. All PCLP values are within 5% and all RMSD values are within 1 Å, which suggested that the CHARMM force field was suitable for simulating AAP, α-LMH and D-mannitol crystals.

Interaction Energy Calculations:

Interaction energies between the two crystal faces were calculated as the pairwise summation of the electrostatic and van der Waals contributions. A 14 Å cutoff was used for the non-bonded interactions. Crystal slabs of the (100) and (0-11) faces of AAP were built with dimensions of 4×4 unit cells and a depth of at least 14 Å. For example, a 2 Å×4B×4C supercell was used for the (100) face where the depth of the slab is given as 2 Å(14.18 Å). Crystal slabs of the (0-11) and (00-1) faces of α-LMH and D-mannitol respectively were built with the smallest dimension of the substrate surface being at least 28 Å larger than the biggest dimension of the AAP surface. The depth of the substrate slab was at least 14 Å. This gave sufficient space around the edges of the AAP slab for the interaction energy calculation.

Figure 7:
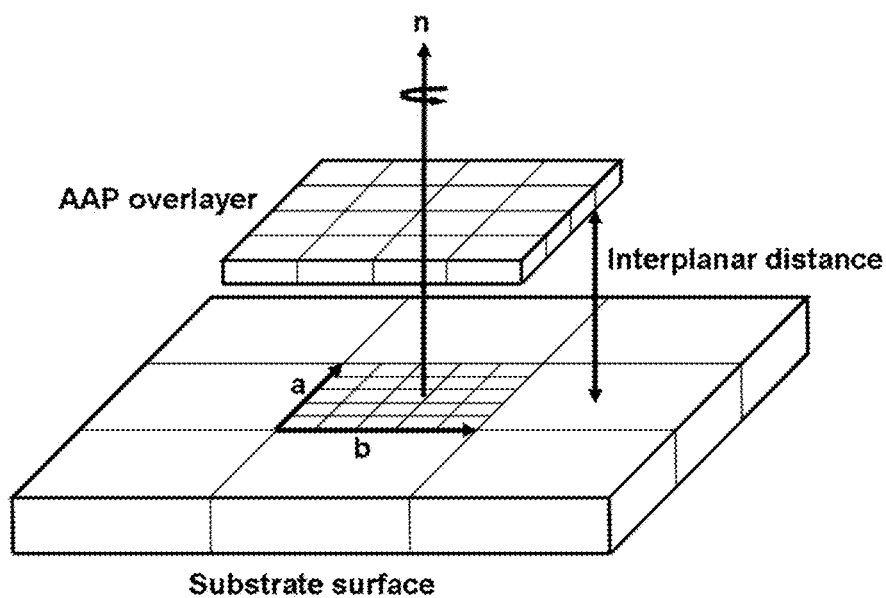
FIG. 7 shows a schematic showing the construction of the interaction energy surface between the AAP overlayer and the substrate surface, according to some embodiments.

The 4D interaction energy surface (PES) was constructed for the AAP overlayer on the crystal substrate surface by placing the two crystal faces parallel to each other and gradually moving the AAP slab closer to the substrate surface using a step size of 0.2 Å. At each fixed interplanar distance, the AAP slab was moved along the two surface axes, a and b, of the substrate for at least one unit cell length with a step size of 0.4 Å. After each movement of the AAP slab along the substrate surface the slab was rotated around its normal direction, n, for 360° (step size 5°). A schematic representation of the methodology is shown in FIG. 7. The interaction energies between the AAP and substrate crystal faces were evaluated and normalized by the number of surface cells making up the AAP slab (16 in this study).

Selection of Substrates

Previous studies have demonstrated the use of interfaces with the specific aim of promoting the nucleation and growth of the fastest growing face of a crystalline material. These interfaces were chosen based on similarities in molecular functionality and hydrogen bonding with the fastest growing face of the target compound. Initially it was hypothesised that by selecting crystalline substrates that could potentially template the nucleation and growth of the fastest growing face of the stable polymorph of AAP, commonly referred to as Form I, a substantial increase in nucleation kinetics would be observed.

Figure 8:
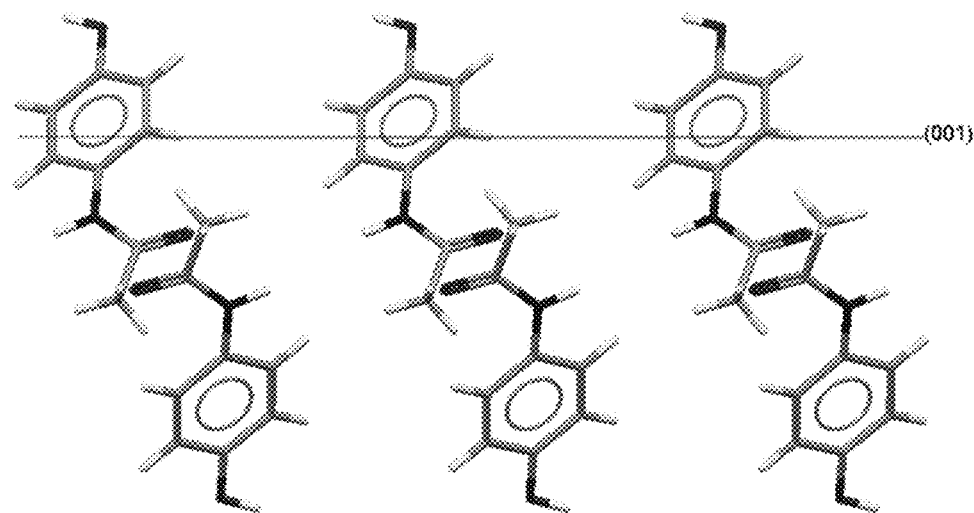
FIG. 8 depicts the fastest growing face (001) of AAP Form I, according to some embodiments.

The fastest growing faces of AAP Form I have previously been determined to be the (001) and (111) faces. The surface chemistry of both faces was analysed using the crystal structure analysis software, Mercury 2.4. Based on this analysis it was decided to attempt to template the nucleation of the (001) face. The (001) face, as shown in FIG. 8, is rich in hydroxyl groups and growth of this face is facilitated through hydrogen bonding involving the hydroxyl groups which act as both hydrogen bond acceptors (O . . . H—N) and donors (O—H . . . O↑C). Therefore crystalline substrates whose crystal faces are hydroxyl group rich may be successful at promoting nucleation through preferential interactions with the AAP nucleus. To this end α-LMH and D-mannitol were chosen as substrates to be used in this study.

Graphite, L-histidine and sodium chloride were chosen due to their crystal lattice parameters and molecular functionalities being different to those of α-LMH and D-mannitol to ensure a wide spectrum of crystalline substrates was tested. It should be noted that in addition to the substrates being chosen based on their functionalities they were also selected as they display no detectable solubility in ethanol.

Results and Discussion

Effect of Functionality on Nucleation Induction Time:

The effectiveness of the five chosen substrates at promoting nucleation of AAP was measured by determining their effect on the nucleation induction time, τ. This is generally equal to the time elapsed between the generation of supersaturation and the point at which a detectable amount of the crystalline phase is observed. τ is a useful measure of a substrates' ability to promote nucleation as it can be substantially reduced if the substrate lowers the free energy barrier to nucleation. As nucleation is a stochastic process in order to demonstrate that any reduction in τ was an effect of the substrate it was required that all measurements were carried out under substantially similar conditions. X-ray powder diffraction was used to confirm that it was the nucleation induction time of Form I being measured in all cases with any additional peaks in the diffraction patterns correspond to the substrates. Analysis of the AAP crystals by optical microscopy showed that the majority of the AAP crystallized in the bulk of the solution via secondary nucleation rather than on the substrate (FIGS. 9a and 9b). This suggested that once heterogeneous nucleation had occurred on the substrate crystals (FIGS. 9c and 9d), continued agitation of the solution through stirring favored secondary nucleation over crystal growth of AAP on the various substrates.

Figure 9:
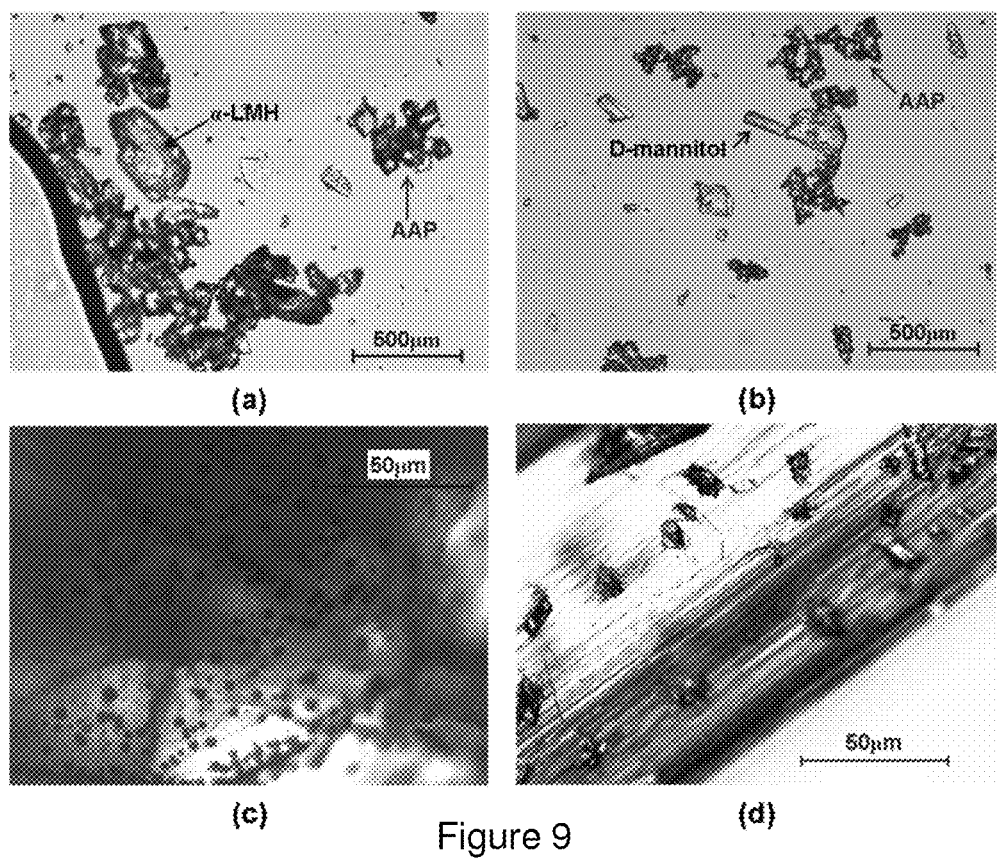
FIG. 9 shows optical micrographs of product obtained from induction time experiments for: (a) AAP crystallized in the presence of α-LMH; (b) AAP crystallized in the presence of D-mannitol; (c) AAP crystals bound to α-LMH; and (d) AAP crystals bound to D-mannitol, according to some embodiments.

FIG. 9: Optical micrographs of product obtained from induction time experiments—(a) AAP crystallized in the presence of α-LMH (b) AAP crystallized in the presence of D-mannitol (c) AAP crystals bound to α-LMH and (d) AAP crystals bound to D-mannitol.

Several assumptions were made when measuring τ: that the time taken to generate the desired supersaturation was negligible, that the time between heterogeneous and secondary nucleation occurring was negligible and that the growth rate of AAP Form I is much faster than the nucleation rate and hence the time between nucleation occurring and the crystals first becoming detectable is minimal.

Figure 10:
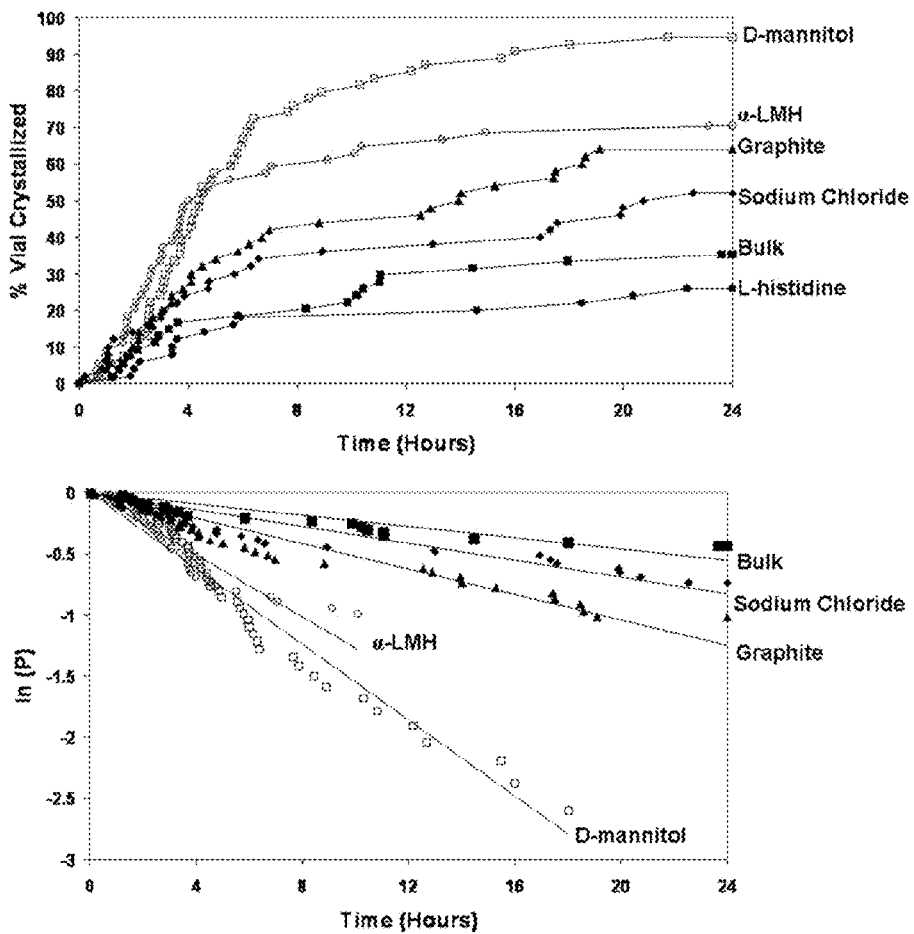
FIG. 10 shows cumulative probability distribution of induction time data for AAP in ethanol (top) and linear regression of the data, using the equation $\ln(P) = -t/\tau$, to obtain the average induction time (bottom), according to some embodiments.

The percentage of vials crystallized as a function of time were plotted to give cumulative probability distributions of nucleation induction time for each system tested. FIG. 10 shows the cumulative probability distributions for the bulk nucleation of AAP Form I from ethanol (supersaturation, $\sigma=(c-c_{sat})/c_{sat}=0.36$), and with each of the five substrates. τ was determined for each system using statistical analysis. It was assumed that nucleation follows a Poisson distribution (Equation 1). λ is the expected number of occurrences in the interval and k is the exact number of occurrences. If k=0 and λ=−t/τ, then the probability of observing no nucleation events within a time, t, is given by equation 2 which is consistent with first order kinetic expressions previously used for studying nucleation events.

$$f(\lambda, k) = \frac{\lambda^k e^{-\lambda}}{k!} \quad (1)$$

$$P = \exp(-t/\tau) \quad (2)$$

FIG. 10: Top—cumulative probability distribution of induction time data for AAP in ethanol (σ=0.36). Bottom—linear regression of the data, using the equation ln (P)=−t/τ, (where P is the probability a solution will not crystallize within a given time, t) to obtain the average induction time, τ.

Using linear regression, plotting ln(P) against t (FIG. 10), the average induction times and associated errors were calculated (Table 3). Both α-LMH and D-mannitol showed the largest reduction in τ compared to that determined for bulk nucleation. This demonstrated that, as predicted, both were able to greatly enhance nucleation kinetics. A decrease in τ was also observed when graphite and sodium chloride were used as the substrate but not to the same extent as α-LMH and D-mannitol. L-histidine showed no measureable decrease in τ compared to bulk nucleation, suggesting that it had no effect on the nucleation kinetics.

TABLE 3

Average induction times, τ, for AAP Form I from ethanol (σ = 0.36) with various crystalline substrates.

| Substrate | Average induction times, τ (mins) | $R^2$ (linear regression) |
|---|---|---|
| None (Bulk) | 1930 ± 85 | 0.9699 |
| α-LMH | 410 ± 11 | 0.9788 |
| D-mannitol | 390 ± 8 | 0.9795 |
| Graphite | 1080 ± 32 | 0.9731 |
| Sodium Chloride | 905 ± 19 | 0.9925 |
| L-histidine | 1910 ± 95 | 0.9781 |

Lattice Matching Vs Molecular Functionality:

The interface between substrate and overlayer lattices can be described by 7 parameters—$a_1$, $a_2$, α (substrate), $b_1$, $b_2$, β (overlayer) and θ (the orientation or azimuthal angle). Where $a_1$, $a_2$, $b_1$ and $b_2$ are the distances between concurrent lattice points and α and β are the angles between them. θ describes the orientation of the overlayer with respect to the substrate. There are three modes of lattice registry possible; commensurism, coincidence and incommensurism. Commensurism and coincidence correspond to a total or partial lattice match respectively. Incommensurism signifies a lattice mismatch. In order to determine the nature of the lattice match between AAP Form I with α-LMH or D-mannitol it was first necessary to determine which faces of AAP and the substrates were bound together.

This was achieved by growing single crystals of AAP Form I onto single crystals of the substrate and using single crystal X-ray diffraction to index the crystal faces. Suitable sized single crystals of the substrates (700-1000 μm) were used to seed a saturated solution of AAP in ethanol and subsequently cooled using the method described in the experimental section. The low supersaturation generated ensured the nucleation and growth of a solitary single crystal on the substrate suitable for X-ray diffraction (between 300-500 μm) after approximately 10 hours. Thereafter, the Miller indices of AAP and the substrate crystal faces were identified in order to determine which crystal faces were bound together (FIG. 11).

Figure 11:
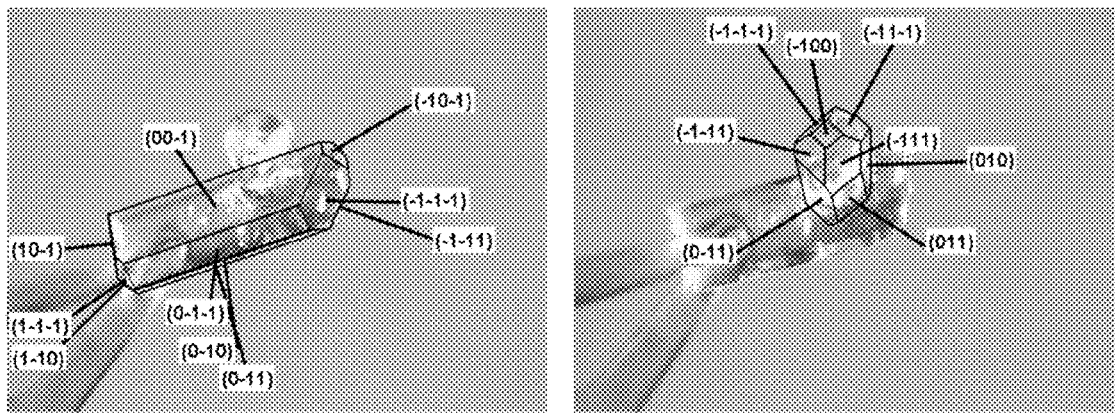
FIG. 11 shows the Miller indices of crystal faces, determined by single crystal X-ray diffraction, for: a) D-mannitol; and b) AAP, according to some embodiments.

FIG. 11: Miller indices of crystal faces, determined by single crystal X-ray diffraction, for a) D-mannitol and b) AAP.

The results showed that for the AAP/α-LMH system it was the (0-11) face of both crystals which were bound. For AAP/D-mannitol, the (100) face of AAP Form I was bound to the (00-1) face of D-mannitol. These experiments were repeated three times for both systems to ensure reproducibility of the results and in all cases the first AAP crystal observed was always bound to the same substrate face by the same AAP crystal face. These data also confirmed that the initial hypothesis of these substrates promoting the nucleation of the fastest growing face of AAP Form I, the (001) face, to be incorrect. Furthermore, it should be noted that if the substrate crystals were left in solution until the supersaturation was depleted, further crystallization of AAP on multiple substrate faces was observed (FIG. 12).

Figure 12:
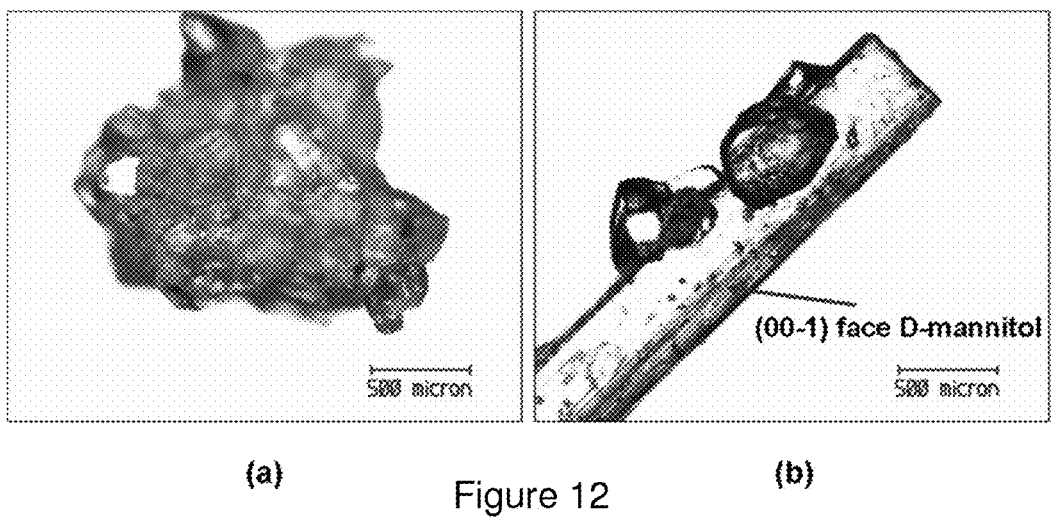
FIG. 12 shows: a) α-LMH single crystal covered in AAP crystals; and b) D-mannitol single crystal with AAP crystals bound to faces other than (00-1), according to some embodiments.

FIG. 12: a) α-LMH single crystal covered in AAP crystals and b) D-mannitol single crystal with AAP crystals bound to faces other than (00-1).

Once the bound crystal faces for each system had been established the lattice parameters for each face were determined. The distances and angles between identical lattice points for each surface were measured using Mercury 2.3 and the results are presented in Table 4.

TABLE 4

The lattice parameters of the AAP, α-LMH and D-mannitol crystal faces used in the epitaxy study.

| AAP/α-LMH | Crystal Face (hkl) | $a_1$ (Å) | $a_2$ (Å) | α (°) |
|---|---|---|---|---|
| α-LMH | (0-11) | 15.19 | 9.57 | 95.85 |
| AAP | (0-11) | 14.84 | 7.09 | 96.12 |

| AAP/ D-mannitol | Crystal Face (hkl) | $b_1$ (Å) | $b_2$ (Å) | β (°) |
|---|---|---|---|---|
| D-mannitol | (00-1) | 16.9 | 8.69 | 90 |
| AAP | (100) | 11.62 | 9.23 | 90 |

The degree of lattice registry between the AAP and substrate crystal faces was evaluated using EpiCalc Version 5. EpiCalc calculates the degree of lattice match between two 2D lattices as a dimensionless potential energy, $V/V_0$. $V/V_0$ represents a 'goodness-of-fit' between the overlayer and substrate lattices and can only take a value between $-0.5 \leq V/V_0 \leq 1$. The different modes of epitaxy are represented by the following values; incommensurism=1, coincidence=0.5, commensurism on a non-hexagonal substrate lattice=0 and commensurism on a hexagonal substrate=−0.5. The software required the following information in order to complete the calculations; the 2D lattice parameters for the overlayer and substrate, the range and step size of θ to be tested (0°≤θ≤180°, step size—0.25°) in and the size of the overlayer. The size of the overlayer used to perform the calculations, in every case, was $25a_1 \times 25a_2$. The results were given as the optimal orientation of the AAP lattice (θ) on the crystalline substrate surface and the corresponding $V/V_0$ minimum. For AAP/α-LMH: θ=19.25°, $V/V_0$~1 and AAP/D-mannitol: θ=39.75°, $V/V_0$~1. Each AAP/substrate system exhibited incommensurism. Therefore a lattice match between the substrates and monoclinic AAP crystal faces was not solely responsible for the observed enhancement in nucleation kinetics.

Next EpiCalc was used to assess the potential for a lattice match between graphite and different crystal faces of AAP Form I. This was carried out using the (100) and (0-11) faces of AAP and the (002) face of graphite. The (002) face of graphite was chosen as it was shown by XRPD (FIG. 8), due to preferred orientation, to be highly prevalent in the graphite samples used in the induction time experiments. The X-ray powder diffraction spectra showed a large peak at about 27 2 Theta (°), which correlated with the 002 face and a d spacing of 3.34 Angstroms; and a smaller peak at about 55 2 Theta (°).

The EpiCalc results were as follows: Graphite(002)/AAP (100): $\theta=57.75$, $V/V_0\sim0.7$ and Graphite(002)/AAP(0-11)— $\theta=173.75$, $V/V_0\sim0.5$. Both crystal faces of AAP display a coincident lattice match with the (002) face of graphite. This result shows that the potential exists for a greater lattice match between graphite and certain crystal faces of AAP than there is between the known bound faces of AAP and D-mannitol or $\alpha$-LMH. However it has been shown that graphite is not as effective at reducing the nucleation induction time of AAP as either D-mannitol or $\alpha$-LMH. Therefore it is reasonable to conclude that, for AAP Form I, the surface functionality of the substrate is important as well as achieving a lattice match when promoting nucleation. Therefore in the following section, it is described how molecular modelling can be used to gain a better understanding of the epitaxial relationship between AAP and $\alpha$-LMH/D-mannitol.

Figure 13:
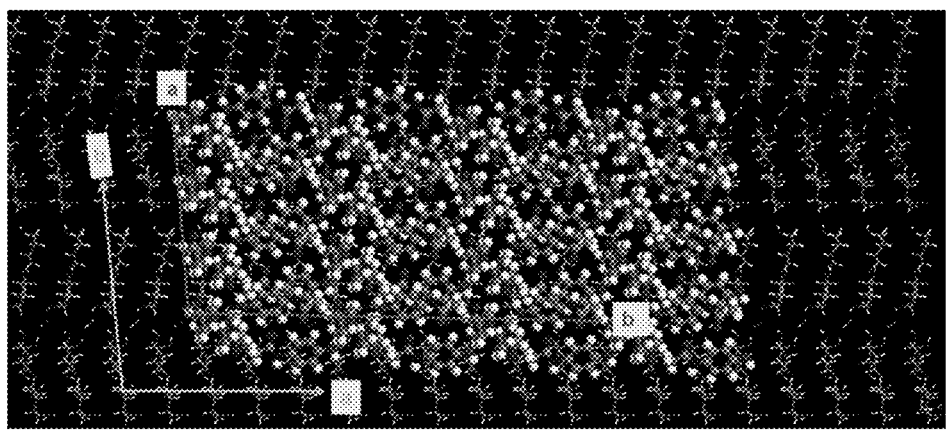
FIG. 13 depicts the most energetically favorable orientation of AAP (0-11) upon α-LMH (0-11), according to some embodiments.
Figure 13:
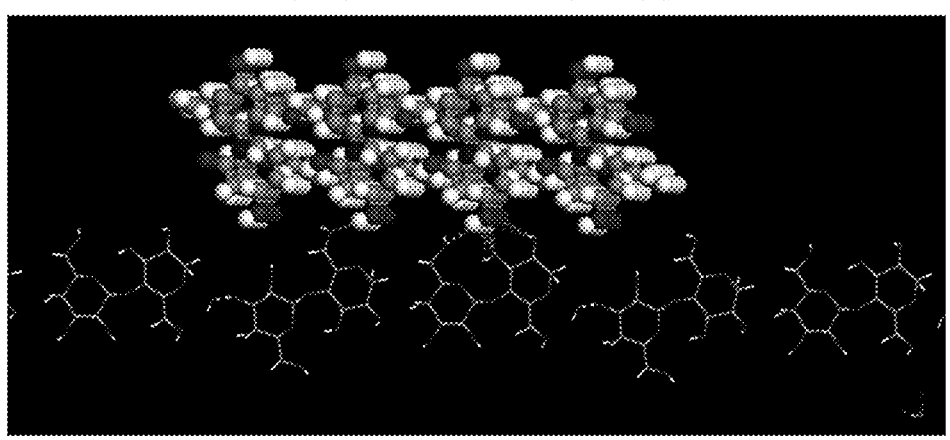
Figure 14:
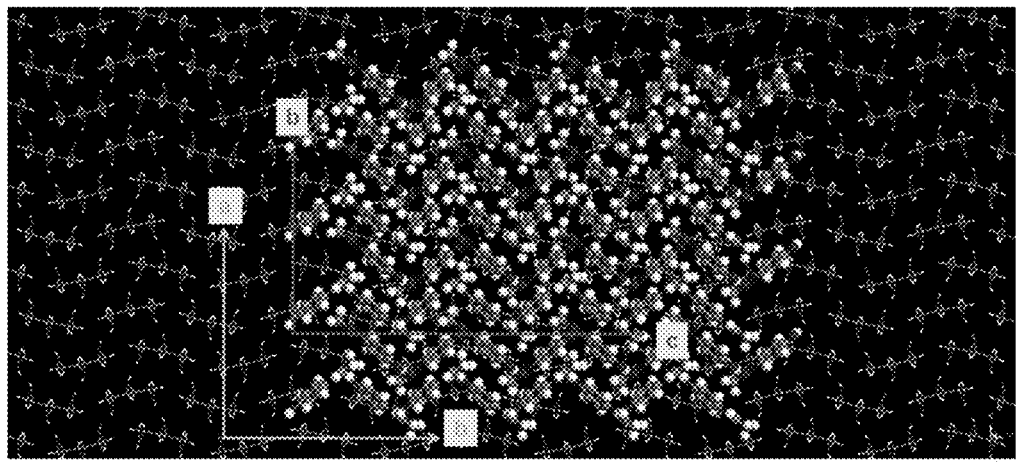
FIG. 14 depicts the most energetically favorable orientation of AAP (100) upon D-mannitol (00-1), according to some embodiments.
Figure 14:
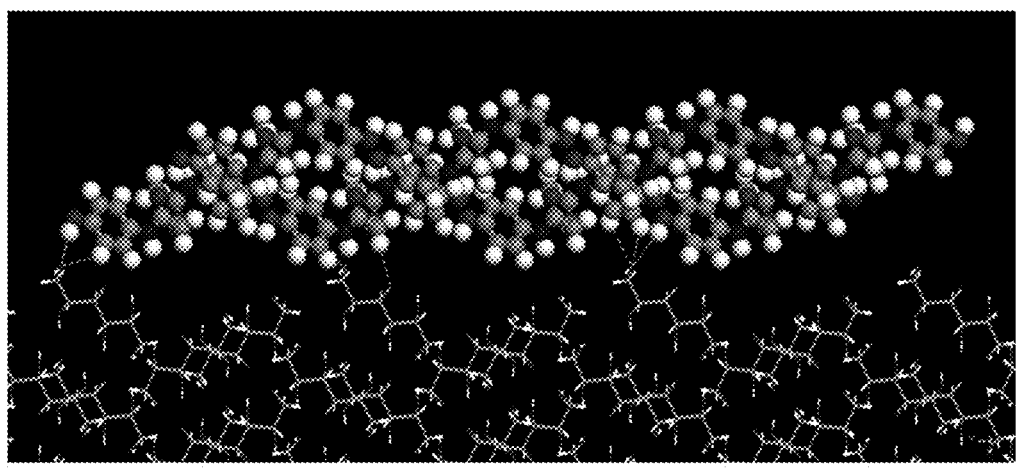

Surface Functionality Directed Epitaxy:

Having established the importance of substrate functionality on promoting the nucleation of AAP it was then necessary to investigate its influence on directing epitaxy. In previous studies computational techniques have been successfully been used to investigate the mechanisms underlying heteroepitaxial growth between polymorphs and crystal twinning. Therefore molecular modelling was used to determine the orientation of the bound AAP crystal face upon the substrate surface upon the interaction energy between the two. Tables giving the calculated interaction energies as a function of interplanar distance, substrate axes (a and b) and angle of rotation, n, for $\alpha$-LMH(0-11)/AAP(0-11) and D-mannitol(00-1)/AAP(100) were prepared. The lowest energy configuration of the (0-11) face of AAP Form I on the (0-11) face of $\alpha$-LMH is shown in FIG. 13. The view perpendicular to the (0-11) plane of $\alpha$-LMH shows an alignment of the a and b axes of AAP and $\alpha$-LMH respectively. This alignment of the axes allows chains of AAP molecules that run parallel to the a axis to orientate themselves directly over chains of $\alpha$-LMH molecules running parallel to its b axis. This orientation of the AAP crystal face allows substantial hydrogen bonding between the hydroxyl groups of the two crystal faces, as can be seen in the view along the $\alpha$-LMH (0-11) plane. The same orientation effect was also observed between the AAP (100) and D-mannitol (00-1) faces (FIG. 14). The molecules in the D-mannitol (00-1) face pack such that they form chains across the surface of the face that run parallel to its b axis. A similar packing arrangement is observed for the AAP (100) face, with the chains parallel to the c axis. In the lowest energy configuration, the AAP (100) face is orientated so that there is alignment of the D-mannitol b axis with the c axis of AAP. Once again this orientation effect allows for the chains of AAP molecules to align themselves over the D-mannitol chains and to form substantial hydrogen bonding between the surfaces.

The results of this study infer that in the case of AAP epitaxial ordering is driven, in part, by hydrogen bonding. Interestingly, in both cases the functional groups involved in hydrogen bonding between the AAP and substrate crystal faces differs in adjacent unit cells.

FIG. 13: The most energetically favourable orientation of AAP (0-11) upon $\alpha$-LMH (0-11). FIG. 14. The most energetically favourable orientation of AAP (100) upon D-mannitol (00-1).

It is also possible to hypothesise a nucleation mechanism in which AAP molecules are adsorbed at the substrate surface through preferential hydrogen bonding interactions and epitaxial ordering of the pre-nucleation aggregate by the substrate crystal face allows chains of AAP molecules to align over the chain motif running across the surface of both substrates. In so doing the pre-nucleation aggregate may be stabilised through an extensive array of hydrogen bonds.

In conclusion, the rational design of crystalline surfaces for heteroepitaxy is a necessity in the manufacture of materials with controllable properties. Therefore understanding the mechanisms driving epitaxy, at a molecular level, is important. Here, insights into the mechanisms controlling nucleation on crystalline substrates were provided.

This example describes the heterogeneous crystallization of acetaminophen (AAP) on a variety of crystalline substrates with differing crystal lattices and functionalities. The results show that substrates displaying incommensurism with AAP but whose functionality matches, such as $\alpha$-LMH and D-mannitol, reduce the nucleation induction time of AAP, in some cases, to a greater extent than substrates that share a partial lattice match with AAP but contrasting functionality. By providing computational evidence it was possible to study the epitaxial ordering of AAP on $\alpha$-LMH and D-mannitol. The (0-11) and (00-1) faces of $\alpha$-LMH and D-mannitol respectively are able to orientate the AAP pre-nucleation aggregates in such a way that chains of AAP molecules align over chains of substrate molecules running across their surfaces. This orientation is energetically favourable and allows for the formation of extensive hydrogen bonding between the substrate and AAP surfaces.

These results demonstrate that molecular functionality of crystalline substrates is important in promoting heterogeneous nucleation of AAP. Epitaxial ordering of AAP on two substrates has also been shown to be greatly influenced by the molecular functionality, with the AAP orientated on the substrate surface in such a way to utilize as many hydrogen bonding groups as possible to stabilize the pre-nucleation aggregate.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed:

1. A method for facilitating crystallization of a selected polymorphic form of a molecule, comprising:
    providing a small organic molecule having more than one polymorphic form and comprising bonding functional groups, wherein the small organic molecule has a molecular weight of less than 2,000 g/mol;
    providing a substrate comprising a crystalline template that has a template unit cell dimension and a template space group and comprises template functional groups on at least one surface, wherein:
        the template functional groups are complimentary to and capable of forming a bond with the bonding functional groups of the small organic molecule,
        the template space group is complimentary to a space group of a single polymorphic form of the small organic molecule, and
        the template unit cell dimension is complimentary to an unit cell dimension of the single polymorphic form of the small organic molecule;
    exposing the substrate to the small organic molecule; and
    causing at least some of the bonding functional groups of the small organic molecule to bond to at least some of the template functional groups thereby allowing the small organic molecule to crystallize on the at least one surface to form a crystal having the single polymorphic form, wherein the average induction time is decreased by a factor of at least three, under substantially similar conditions, as compared to the average induction time using a template not comprising the template functional groups, the template space group, and/or the template unit cell dimension that are complimentary to the single polymorphic form.

2. The method of claim 1, wherein the single polymorphic form of the small organic molecule has unit cell dimensions A×B×C and the crystalline template has unit cell dimensions X×Y×Z, wherein:

$$X = A \pm (R \times S);$$

$$Y = B \pm (R \times S); \text{ and}$$

$$Z = C \pm (R \times S),$$

wherein S is between 0 and 0.05 and R is the longest of A, B, and C.

3. The method of claim 1, wherein the crystalline template has the same space group as the single polymorphic form.

4. The method of claim 1, wherein the small organic molecule is a pharmaceutically active agent.

5. The method of claim 1, wherein the single polymorphic form is a disappearing polymorph.

6. The method of claim 1, wherein the single polymorphic form is metastable at an isolation temperature.

7. A method for facilitating crystallization of a selected polymorphic form of a molecule, comprising:
  selecting a single polymorphic form of a small organic molecule and determining a space group, unit cell dimensions A×B×C, and functional groups present on each face A, B, and C, wherein the small organic molecule has a molecular weight of less than 2,000 g/mol;
  selecting a substrate comprising a crystalline template, wherein the crystalline template comprises:
    the same space group as the small organic molecule;
    unit cell dimensions X×Y×Z, wherein X=A±(R×S), Y=B±(R×S); and Z=C±(R×S), wherein S is between 0 and 0.05 and R is the longest of A, B, and C; and
    template functional groups on at least one surface of the substrate which are complimentary to and capable of forming a bond with bonding functional groups of the small organic molecule;
  exposing the crystalline substrate to a solution comprising the small organic molecule; and
  causing at least some of the bonding functional groups of the small organic molecule to bond to at least some of the template functional groups thereby allowing the small organic molecule to crystallize on the at least one surface to form a crystal having the single polymorphic form.

8. The method of claim 7, wherein the small organic molecule is a pharmaceutically active agent.

9. The method of claim 7, wherein the single polymorphic form is a disappearing polymorph.

10. The method of claim 7, wherein the single polymorphic form is metastable at an isolation temperature.

11. A system for facilitating crystallization of a selected polymorphic form of a molecule, comprising:
  a small organic molecule having more than one polymorphic form and comprising bonding functional groups, wherein the small organic molecule has a molecular weight of less than 2000 g/mol; and
  a substrate comprising a crystalline template that has a template unit cell dimension and a template space group and comprises template functional groups on at least one surface, wherein:
    the template functional groups are complementary to and capable of forming a bond with the bonding functional groups of the small organic molecule,
    the template space group is complimentary to a space group of a single polymorphic form of the small organic molecule, and
    the template unit cell dimension is complimentary to a unit cell dimension of the single polymorphic form.

12. The system of claim 11, wherein the single polymorphic form of the small organic molecule has unit cell dimensions A×B×C and the crystalline template has unit cell dimensions X×Y×Z, wherein:

$$X = A \pm (R \times S);$$

$$Y = B \pm (R \times S); \text{ and}$$

$$Z = C \pm (R \times S),$$

wherein S is between 0 and 0.05 and R is the longest of A, B, and C.

13. The system of claim 11, wherein the crystalline template has the same space group as the single polymorphic form.

14. The system of claim 11, wherein the small organic molecule is a pharmaceutically active agent.

15. The system of claim 11, wherein the single polymorphic form is a disappearing polymorph.

16. The system of claim 11, wherein the single polymorphic form is metastable at an isolation temperature.

* * * * *